(12) United States Patent
Kim

(10) Patent No.: US 6,483,793 B1
(45) Date of Patent: Nov. 19, 2002

(54) RESTORATION OF DATA AND ASYMMETRY COMPENSATION IN AN OPTICAL DISK REPRODUCING SYSTEM

(75) Inventor: Ii-kwon Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/354,247

(22) Filed: Jul. 15, 1999

(30) Foreign Application Priority Data

Jul. 16, 1998 (KR) ............................................ 98-28842
Jun. 17, 1999 (KR) ............................................ 99-22706

(51) Int. Cl.⁷ ............................................ G11B 7/005
(52) U.S. Cl. ............................... 369/59.22; 369/47.35; 369/59.17
(58) Field of Search .......................... 369/59.22, 47.35, 369/59.17

(56) References Cited

U.S. PATENT DOCUMENTS

| | | | | |
|---|---|---|---|---|
| 5,568,465 A | * | 10/1996 | Hutchins et al. | 369/124 |
| 5,631,891 A | * | 5/1997 | Moritsugu et al. | 369/124 |
| 5,661,713 A | * | 8/1997 | Honma | 369/124 |
| 5,748,045 A | | 5/1998 | Tateishi | 331/17 |
| 5,796,693 A | | 8/1998 | Taguchi et al. | 369/59 |
| 5,870,591 A | | 2/1999 | Sawada | 395/555 |
| 5,892,384 A | | 4/1999 | Yamada et al. | 327/277 |
| 5,892,407 A | | 4/1999 | Ishii | 331/17 |
| 5,920,438 A | * | 7/1999 | Christensen et al. | 360/46 |
| 6,192,016 B1 | * | 2/2001 | Kim | 369/59 |
| 6,301,201 B1 | * | 10/2001 | Takeya | 369/32 |

OTHER PUBLICATIONS

"An Integrated CMOS Mixed–Mode Signal Processor for Disk Drive Read Channel Applications", Beomsup Kim, et al., IEEE, Transactions on Circuits and Systems—II: Analog and Digital Signal Processing, vol. 41, No. 1, Jan. 1994, pp. 1057–1071.
Implementation of PRML in a Rigid Disk Drive, J. D. Coker, et al., IEEE, Transactions on Magnetics, vol. 27, No. 6, Nov. 1991, pp. 4538–4543.

* cited by examiner

*Primary Examiner*—W. R. Young
*Assistant Examiner*—Gautam R. Patel
(74) *Attorney, Agent, or Firm*—Mills & Onello, LLP

(57) ABSTRACT

A data restoring apparatus of an optical disk reproducing system restores data recorded on an optical disk from an RF signal read from the optical disk. The apparatus includes an analog to digital converter (ADC) for digitally converting the RF signal in response to a recovery clock signal and generating the digitally converted signal as a digital RF signal, a viterbi decoder for decoding the digital RF signal with a viterbi decoding method and generating a decoded bit stream as restored data, an adaptive phase error compensator for obtaining the phase error between the RF signal and the recovery clock signal and generating a control voltage corresponding to the phase error, and a voltage controlled oscillator for generating the phase-compensated recovery clock signal by varying the frequency of the recovery clock signal corresponding to the control voltage, wherein the adaptive phase error compensator adds a predetermined number of successive digital RF signals generated around a reference voltage and obtains the addition result as the phase error. It is thereby possible to restore correct data since, when the digital RF signal obtained by digitally converting the RF signal passes the reference voltage, the phase error and the cumulatively added error value is correctly extracted by adding a prior value to the post value and the phase and the reference voltage are compensated for according to the phase error and the cumulatively added error value. Also, it is possible to simply realize and control the filter since the digital filter has a cut-off frequency that is irrespective of disk rotation speed.

35 Claims, 16 Drawing Sheets

FIG. 4
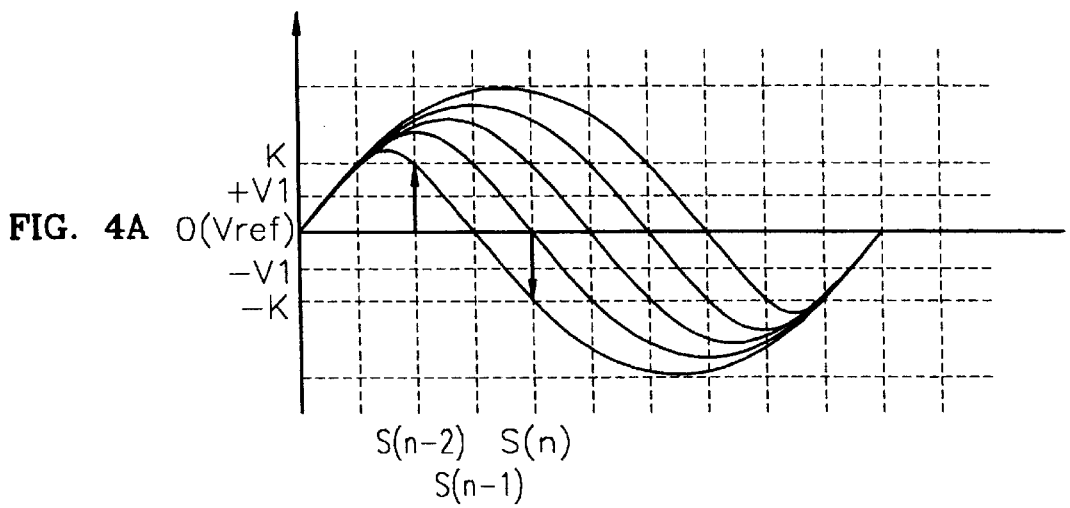
FIG. 4A
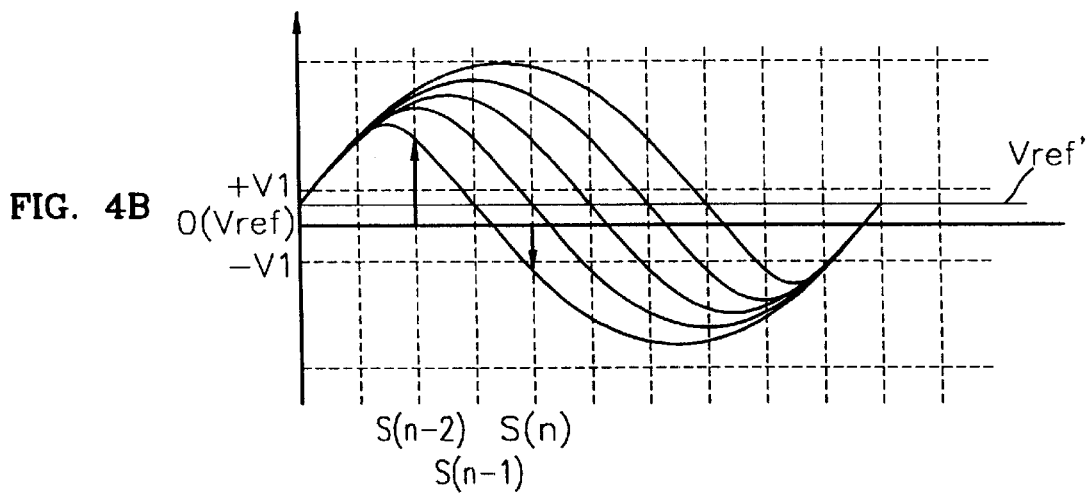
FIG. 4B
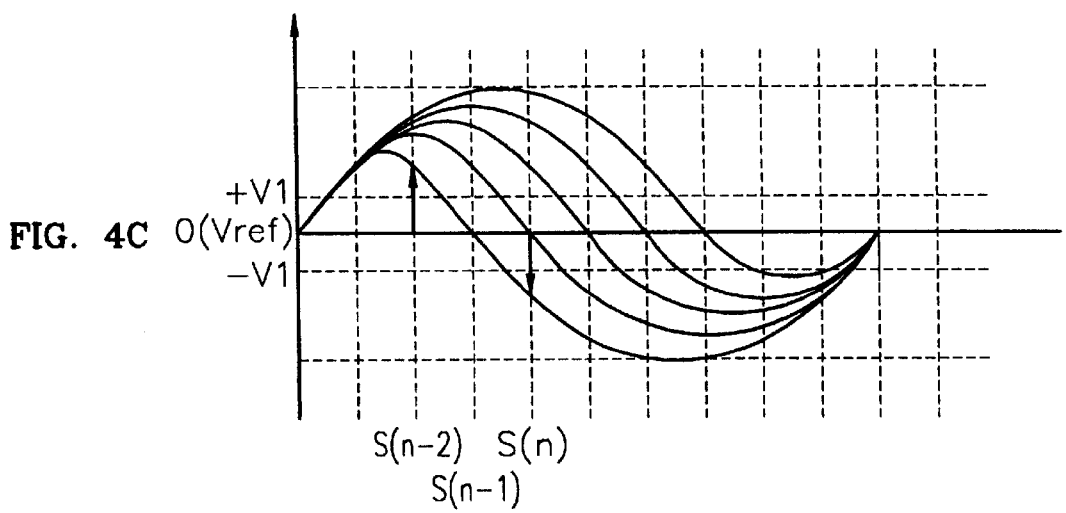
FIG. 4C

FIG. 12
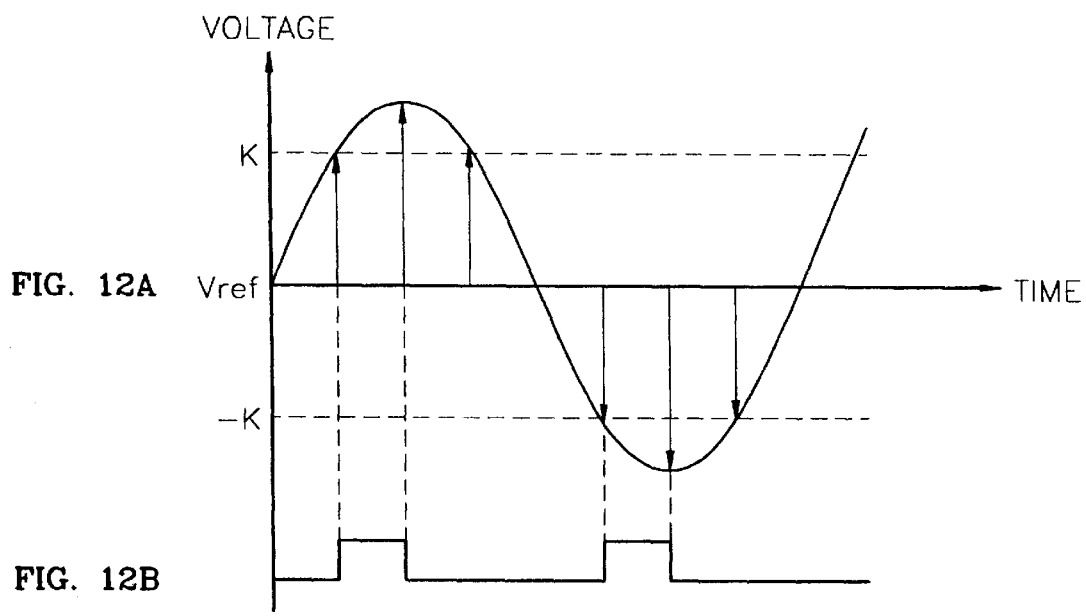
FIG. 12A
FIG. 12B
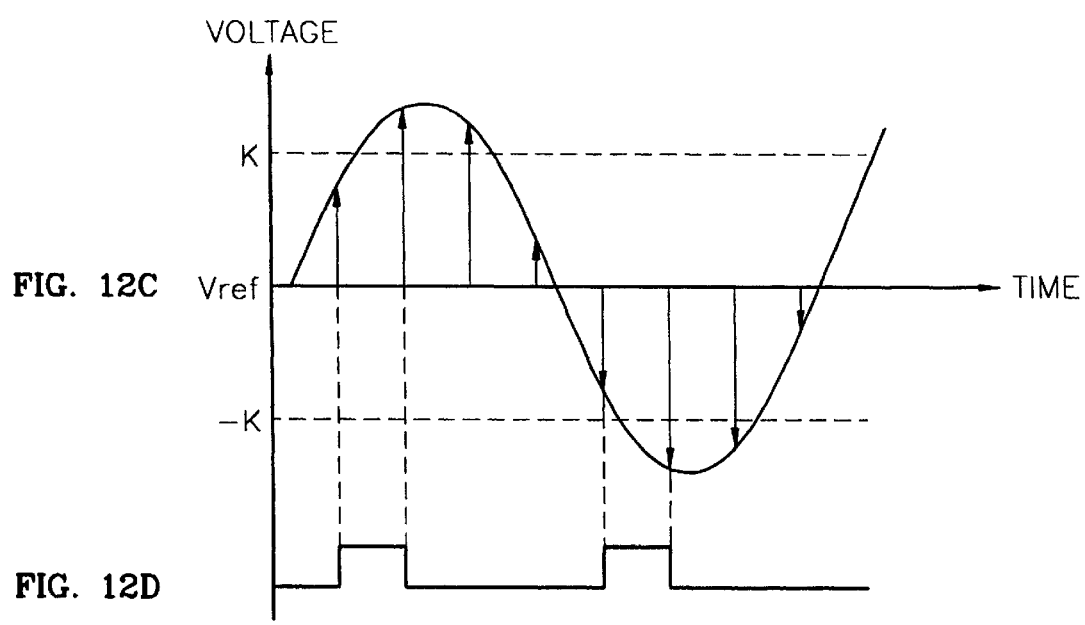
FIG. 12C
FIG. 12D

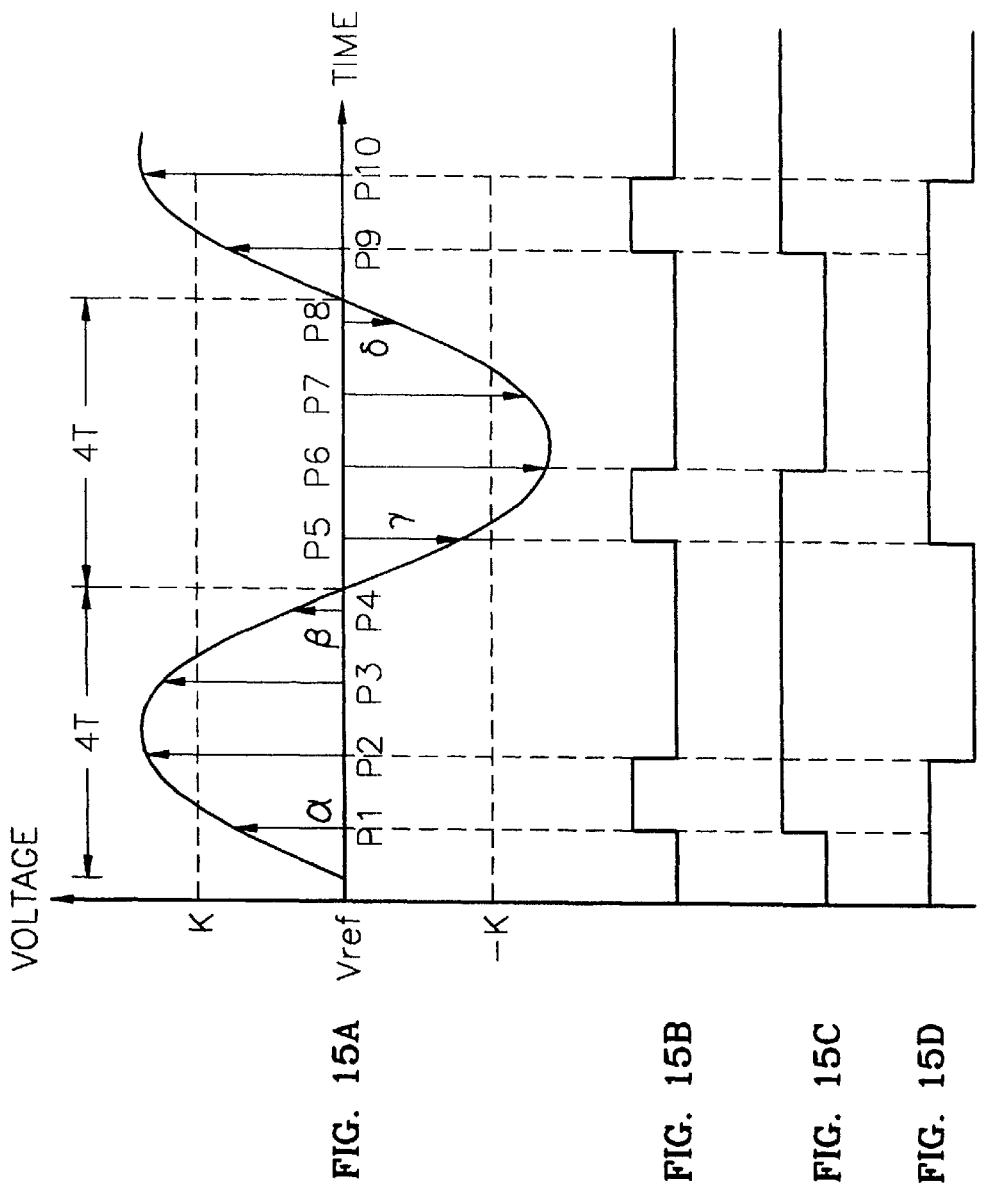

FIG. 17
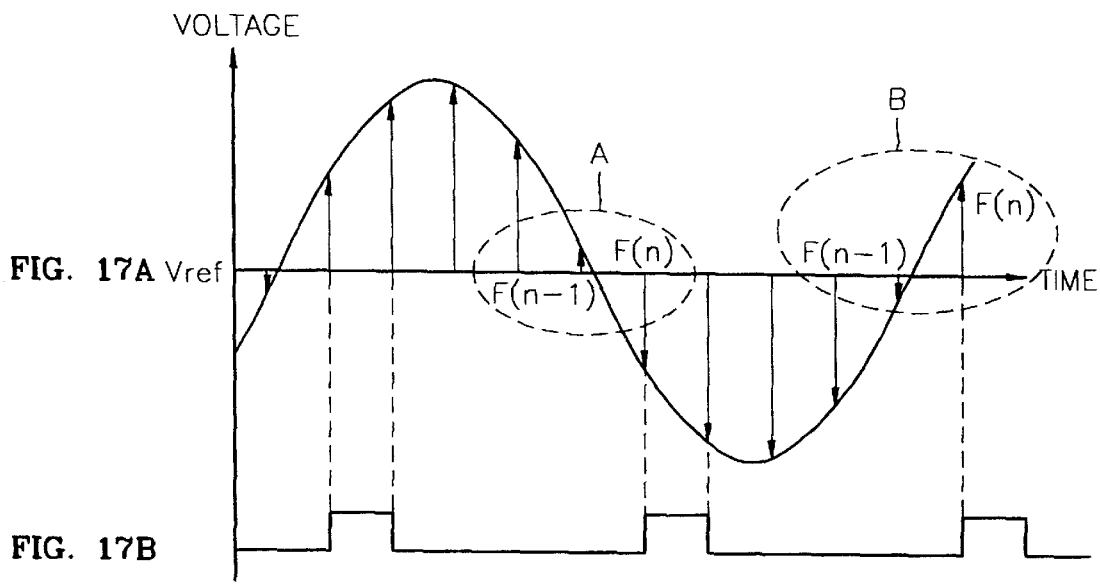
FIG. 17A
FIG. 17B
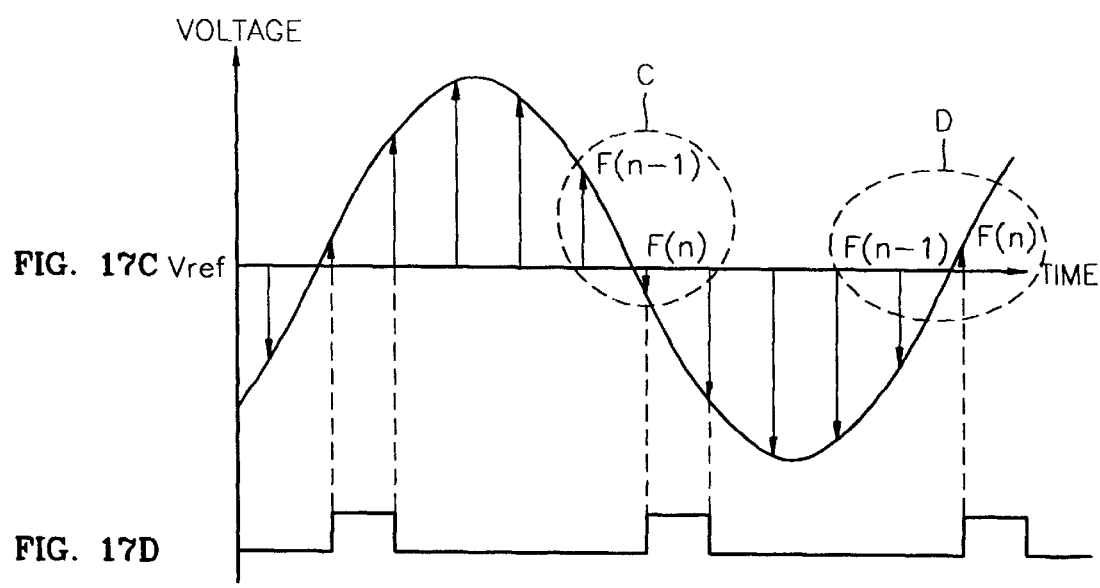
FIG. 17C
FIG. 17D

RESTORATION OF DATA AND ASYMMETRY COMPENSATION IN AN OPTICAL DISK REPRODUCING SYSTEM

BACKGROUND OF THE INVENTION

1. Field of the Invention

The present invention relates to an optical disk reproducing system such as a compact disk player (CDP) and a digital video disk or a digital versatile disk (DVD) player, and more particularly, to a data restoring apparatus in an optical disk reproducing system for restoring data recorded on an optical disk from a radio frequency (RF) signal read from the optical disk.

2. Description of the Related Art

In an optical disk reproducing system, a pick-up circuit includes a photodiode which senses light transmitted to a disk, and reflected from the disk according to the presence of pits on the disk, and converts the sensed, reflected optical signal into an analog RF signal according to whether the voltage of the RF signal is higher or lower than a reference voltage (Vref). The decoded data stream is eight-to-fourteen modulation (EFM) demodulated and is restored to effective 8-bit data.

In such an optical disk reproducing system, the data is classified according to the lengths of the pits on the surface of the disk. However, for a rotating disk, the effective pit lengths vary with disk rotation speed. For example, a faster rotation speed causes the pits to appear shorter in length. To address this issue, a recovery clock signal used for restoring EFM data from an RF signal is locked to the RF signal. Namely, it is possible to restore correct data since the frequency and phase of the recovery clock signal are locked to those of the RF signal even for a time period where the disk rotates at a variable or non-constant speed. A phase locked loop (PLL) is used for locking the frequency and phase of the recovery clock signal to those of the RF signal. In conventional technology, an analog PLL is primarily used.

In the case of a CDP, the recovery clock signal (or a channel bit clock signal) is at a frequency of 4.3218 MHz. In the case of a DVD, the recovery clock signal is 26.16 MHz. In each case, it is possible to obtain a desired data stream when the recovery clock signal is locked to the RF signal when data is reproduced at 1× speed. However, as the data transmission rate becomes higher and when the method of controlling the rotation speed of the disk changes from a constant linear velocity (CLV) to a constant angular velocity (CAV), it is necessary to more finely control the frequency and phase of the recovery clock signal. Also, when the conventional PLL is used, the frequency of the recovery clock signal becomes unstable during the control of the phase since the phase of the recovery clock signal is controlled not by fixing the frequency but by locking the phase by instantaneously changing the frequency.

With recent increasing rotation speeds, the data restoring ability according to the rotation speed of the disk and the data restoring ability by the instability and the distortion factor of the RF signal become the primary variables that affect the performance of the optical disk reproducing system. It is desired that data recorded on disks of various speeds can be correctly restored by a single optical disk reproducing system. Although the RF signal can be unstable due to frequency and phase error or due to a cumulatively-added error value, correct data should be restored by compensating for the instability of the RF signal. However, according to the conventional analog method, filters having cut-off frequencies corresponding to the respective speeds and circuits for controlling the filters are required. Also, in the analog system, data can be lost since it is impossible to variably restore data corresponding to the variety of types of optical disks, the differences between processes of manufacturing the optical disks, and the instability of the optical disk used a recording medium. In particular, as higher-speed transmission and higher data density are required, data-restoring performance deteriorates due to the interference between signals when data is restored according to the analog method.

SUMMARY OF THE INVENTION

To address the above limitations, it is an object of the present invention to provide an apparatus for restoring data in an optical disk reproducing system by which it is possible to restore correct data by digitally calculating frequency and a phase error between a recovery clock signal and an RF signal and compensating for the frequency and a phase error.

It is another object of the present invention to provide an apparatus for restoring data of an optical disk reproducing system by which it is possible to restore correct data by digitally compensating for the asymmetry in the RF signal.

It is still another object of the present invention to provide an apparatus for digitally and correctly compensating for the asymmetry of an analog signal.

Accordingly, to achieve the first object, there is provided a data restoring apparatus in an optical disk reproducing system for restoring data recorded on an optical disk from an RF signal read from the optical disk, comprising an analog to digital converter (ADC) for digitally converting the RF signal in response to a recovery clock signal and generating the digitally converted signal as a digital RF signal, a decoder for decoding the digital RF signal and generating a decoded bit stream as restored data, an adaptive phase error compensator for obtaining the phase error between the RF signal and the recovery clock signal and for generating a control voltage corresponding to the phase error, and a voltage controlled oscillator for generating the phase compensated recovery clock signal by varying the frequency of the recovery clock signal according to the control voltage, wherein the adaptive phase error compensator adds a predetermined number of successive digital RF signals generated around a reference voltage and obtains the sum as the phase error.

To achieve the first object, a data restoring apparatus of an optical disk reproducing system for restoring data recorded on an optical disk from an RF signal read from the optical disk preferably comprises an analog-to-digital converter (ADC) for digitally converting the RF signal in response to a recovery clock signal and generating the converted signal as a digital RF signal, an edge detector for detecting an edge at which the digital RF signal crosses the reference voltage, and generating the detected edge as an edge detection signal, a frequency error compensator for detecting the frequency error between the digital RF signal and the recovery clock signal, generating a control voltage for compensating for the frequency of the recovery clock signal according to the detected frequency error, and locking the control voltage when the frequency of the recovery clock signal is locked to that of the digital RF signal, a phase error compensator for obtaining a phase error indicating whether the phase of the recovery clock signal lags or leads that of the RF signal, and a viterbi decoder for decoding the phase compensated digital RF signal generated by the phase error compensator with a viterbi decoding method and generating the decoded bit stream as restored data.

To achieve the first object, a data restoring apparatus of an optical disk reproducing system for restoring data recorded on the optical disk from the RF signal read from the optical disk comprises an analog-to-digital converter for digitally converting the RF signal in response to the recovery clock signal and generating the converted signal as a digital RF signal, an edge detector for receiving the digital RF signal, detecting an edge at which the digital RF signal crosses the reference voltage, a frequency error compensator for obtaining a maximum coefficient value by cumulatively adding a predetermined value K or the digital RF signal according to the edge detection signal during the duration of the maxim duty signal (14T or 11T) in the RF signal in a period of the predetermined term, a phase error compensator for obtaining a phase error according to whether the phase of the recovery clock signal lags or leads that of the RF signal and generating the phase compensated digital RF signal, and a viterbi decoder for decoding the phase-compensated digital RF signal generated by the phase error compensator by a viterbi decoding method and generating the decoded bit stream as restored data.

To achieve the second object, there is provided a data restoring apparatus of an optical disk reproducing system for restoring data recorded on the optical disk from the RF signal read from the optical disk, comprising an analog-to-digital converter (ADC) for digitally converting the RF signal in response to a recovery clock signal, an adder for adding a reference voltage compensation value to the signal generated by the ADC and generating the addition result as a digital RF signal, a reference voltage for obtaining a cumulatively added error value by adding a predetermined number of digital RF signals successively generated around a reference voltage and generating a reference voltage compensation value according to the obtained cumulatively added error value, and a viterbi decoder for decoding the digital RF signal by a viterbi decoding method and generating the decoded bit stream as restored data.

To achieve the second object, a data restoring apparatus of an optical disk reproducing system for restoring data recorded on the optical disk from the RF signal read from the optical disk preferably comprises an analog-to-digital converter for digitally converting the RF signal in response to a recovery clock signal and generating the digitally converted signal, a digital sum value (DSV) controlling portion for receiving the digitally converted signal and generating a voltage compensation value so that the number of signals having levels higher than a reference voltage is equal to the number of signals having levels lower than the reference voltage, an adder for adding the voltage compensation value to the signal generated by the analog-to-digital converter and generating the addition result as a digital RF signal, and a viterbi decoder for decoding the digital RF signal by a viterbi decoding method and generating the decoded bit stream as restored data.

To achieve the third object, there is provided an apparatus for compensating for the asymmetry of a received analog signal, comprising an analog to digital converter for digitally converting the analog signal in response to a recovery clock signal, an adder for adding a reference voltage compensation value to the signal generated by the ADC and generating the addition result as a digital signal, and a reference voltage for obtaining a cumulatively added error value by adding a predetermined number of successive digital signals around the reference voltage when the digital signal approaches the reference voltage and generating the reference voltage compensation value according to the obtained cumulatively added error value.

To achieve the third object, an apparatus for compensating for the asymmetry of a received analog signal preferably comprises an analog-to-digital converter for digitally converting the analog signal in response to a recovery clock signal, a DSV controller for receiving a digital signal generated by the ADC and generating a voltage compensation value so that the number of signals having levels larger than a reference voltage is equal to the number of signals having levels smaller than the reference voltage, and an adder for adding the voltage compensation value to the signal generated by the ADC and generating the addition result as a digital signal whose asymmetry is compensated for.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 4 is waveforms showing the asymmetry of an RF signal input to the circuit of FIG. 1.

FIG. 12 depict the generation of an edge detection signal (ED) according to the RF signal.

FIG. 15 is waveforms for describing the operations of the counters shown in FIG. 13 when the frequency of the recovery clock signal (PLCK) is locked to that of the RF signal.

FIG. 17 is waveforms for describing the operation of the phase error detector.

DESCRIPTION OF THE PREFERRED EMBODIMENTS

Figure 1:
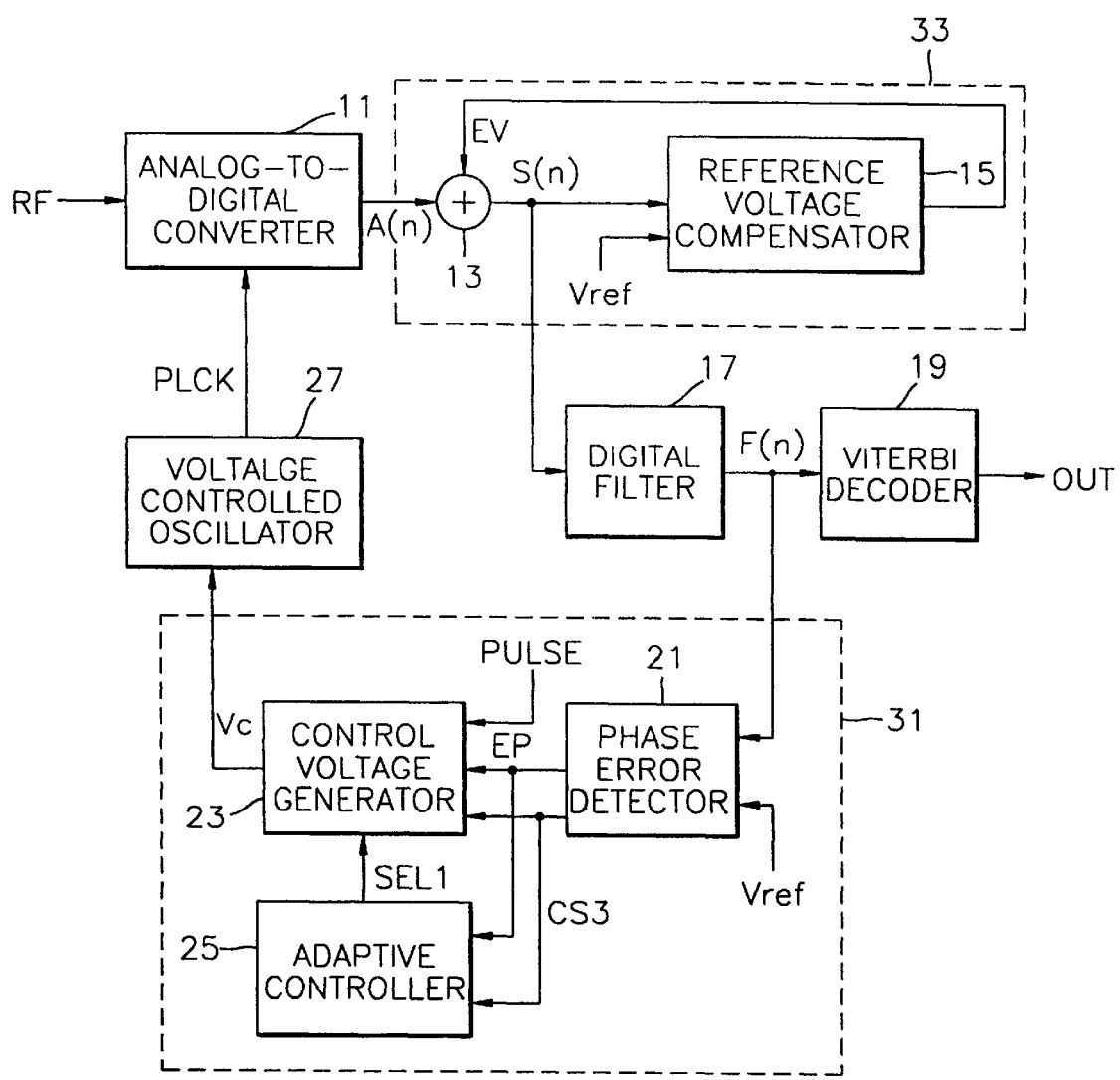
FIG. 1 is a schematic block diagram of an apparatus for restoring data in an optical disk reproducing system according to an embodiment of the present invention.

FIG. 1 is a block diagram of an apparatus for restoring data in an optical disk reproducing system according to an embodiment of the present invention. The apparatus for restoring data of the optical disk reproducing system according to the present invention includes an analog-to-digital converter (ADC) 11, an asymmetry compensator 33, a digital filter 17, a viterbi decoder 19, an adaptive phase error compensator 31, and a voltage controlled oscillator 27.

Although not shown in FIG. 1, the RF signal is received by a pick-up circuit including an optical diode. The ADC 11 converts the received analog RF signal to a digital signal in response to the recovery clock signal (PLCK) output from the voltage controlled oscillator 27, and outputs the digitally-converted signal A(n) to the asymmetry compensator 33. The asymmetry compensator 33 digitally compensates for the asymmetry of the RF signal by receiving the digitally-converted signal A(n) and outputs an asymmetry-compensated digital signal S(n) to the digital filter 17.

The asymmetry compensator 33 preferably includes an adder 13 and a reference voltage compensator 15. The adder 13 adds a reference voltage compensation value (EV) output from the reference voltage compensator 15 to the digitally-converted signal A(n) and outputs the addition result to the reference voltage compensator 15 and the digital filter 17 as the asymmetry-compensated signal S(n). The reference voltage compensator 15 receives the signal S(n), calculates the reference voltage compensation value (EV), and feeds back the calculated value to the adder 13. To be more specific, the reference voltage compensator 15 compares the voltage of the signal S(n) received from the adder 13 with a predetermined reference voltage (Vref) and adds or subtracts the difference between the DC voltage and the reference voltage to or from the signal S(n), thus compensating for the asymmetry of the RF signal so that the DC voltage of the signal S(n) output from the adder 13 is equal to the reference voltage (Vref). The detailed structure and operation of the reference voltage compensator 15 will be described below with reference to FIG. 3.

The digital filter 17 receives the asymmetry compensated signal S(n) from the asymmetry compensator 33 and outputs a signal F(n) whose waveform is shaped as a digital RF signal to the adaptive phase compensator 31 and the viterbi decoder 19. Since the RF signal is converted into a digital signal through the ADC 11 and passes through the digital filter 17, it is possible to shape the waveform using a single digital filter 17 regardless of the speed of the disk from which data is currently reproduced. The viterbi decoder 19 decodes the digital RF signal F(n) output from the digital filter 17 to a bit stream of "0"s and "1"s by a viterbi decoding method and outputs the decoded bit stream to an eight-to-fourteen demodulation (EFDM) unit (not shown) through an output terminal OUT. The Viterbi decoding method, a well known decoding method, is provided on pages 454 through 461 of Vol. Com-34 of the IEEE paper on "Transaction Detection of Class 4 Partial Response on a Magnetic Recording Channel" published on May 1986 by Roger W. Wood and David A. Petersen.

The adaptive phase error compensator 31 receives the digital RF signal F(n), extracts a predetermined number of, for example, three, successive digital RF signals generated around the reference voltage (Vref), and adds them to each other. The addition result is the phase error between the RF signal and the recovery clock signal (PLCK). The adaptive phase error compensator 31 generates a control voltage for controlling the voltage controlled oscillator 27 corresponding to the phase error. The adaptive phase error compensator 31 preferably includes a phase error detector 21, an adaptive controller 25, and a control voltage generator 23.

The phase error detector 21 receives the digital RF signals, adds a predetermined number of successive digital RF signals generated around the reference voltage (Vref), detects the phase error (EP), and outputs the detected phase error (EP) to the adaptive controller 25 and the control voltage generator 23. The phase error detector 21 detects a section of the signal in which the digital RF signal F(n) crosses the reference voltage Vref and generates the detection result as the third control signal CS3. The adaptive controller 25 cumulatively adds the phase error (EP) generated by the phase error detector 21 over a predetermined time period, obtains the mean value of the phase error (EP), referred to as the "error mean value", and outputs a signal to the control voltage generator 23 for controlling the magnitude of the control voltage according to the magnitude of the error mean value. The control voltage generator 23 generates a control voltage (Vc) according to the signal generated by the adaptive controller 25 and outputs the control voltage (Vc) to the voltage controlled oscillator 27. The structure and operation of the phase error detector 21, the adaptive controller 25, and the control voltage generator 23 will be described below with reference to FIGS. 5, 7, and 8.

The voltage controlled oscillator 27 varies the frequency of the recovery clock signal (PLCK) in response to the control voltage (Vc) output from the control voltage generator 25 and outputs the recovery clock signal (PLCK), which is controlled to have the same phase as that of the RF signal, to the ADC 11.

Although the present specification describes an embodiment of compensating for the phase error and the reference voltage (Vref), it is possible to restore relatively correct data by only compensating for the phase error by the adaptive phase error compensator 31 and the voltage controlled oscillator 27. Also, it is possible to restore relatively correct data by only compensating for the asymmetry of the RF signal by the asymmetry compensator 33.

Figure 2A:
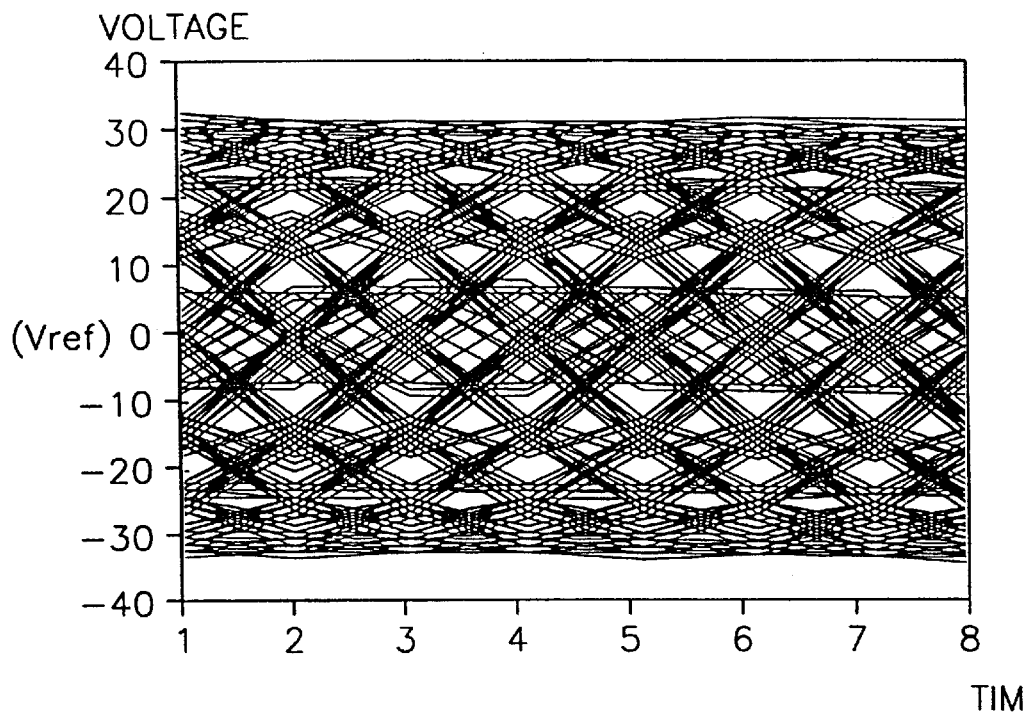
FIGS. 2A and 2B depict the shaping of waveforms by the digital filter shown in FIG. 1.
Figure 2B:
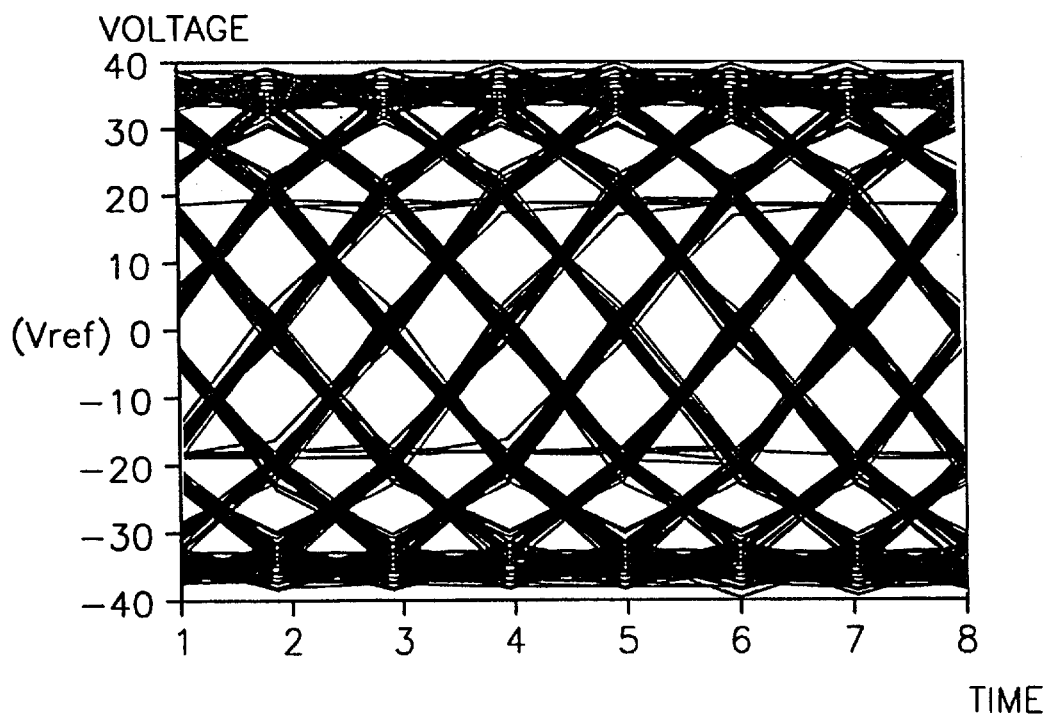

FIGS. 2A and 2B show the shaping of the RF signal by the digital filter 17 of FIG. 1. FIG. 2A shows the RF signal including the interference between signals before passing through the digital filter 17. FIG. 2B shows the digital RF signal F(n) whose waveform is shaped after passing through the digital filter 17.

Figure 3:
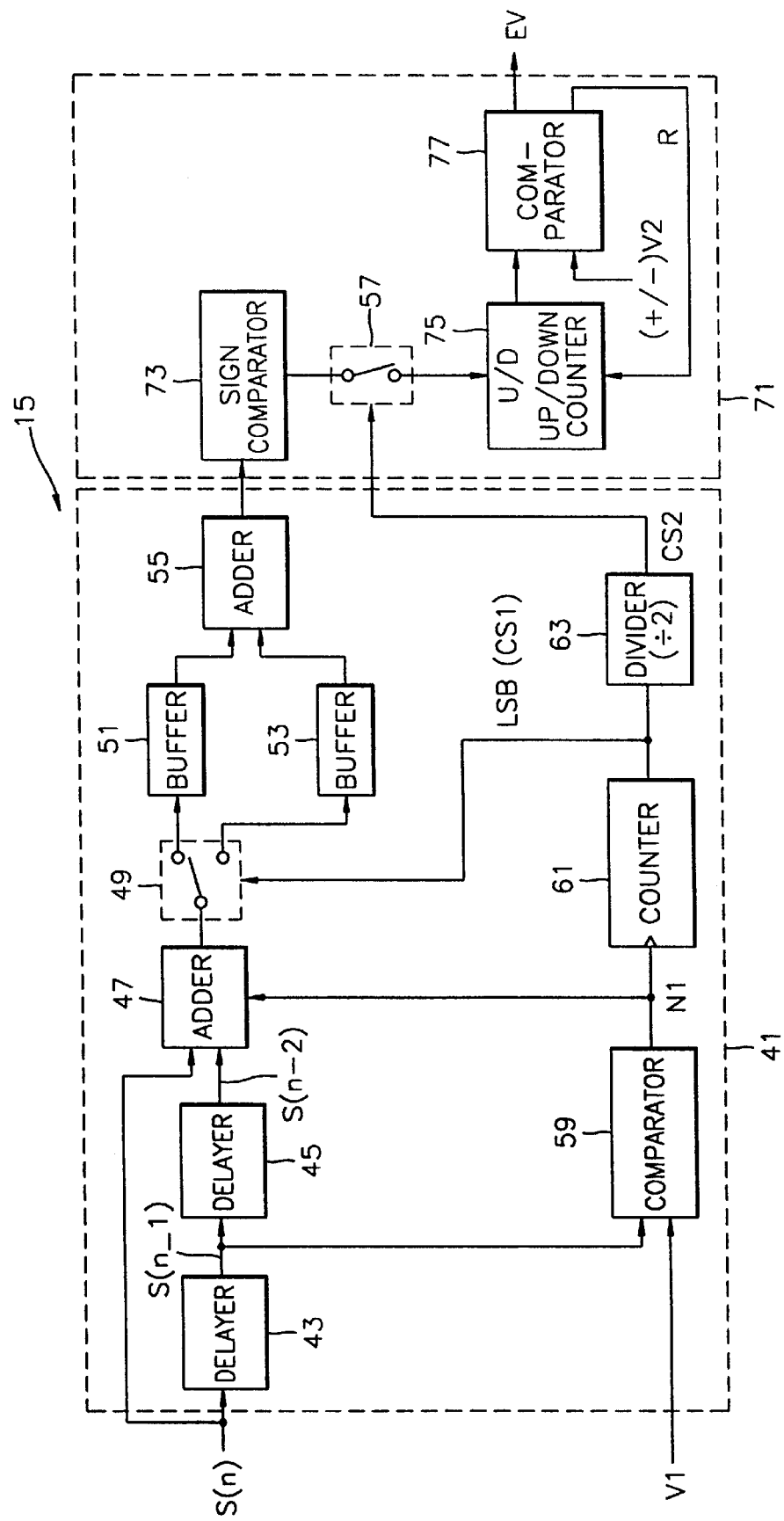
FIG. 3 is a detailed block diagram of the reference voltage compensator of FIG. 1 in accordance with the present invention.

FIG. 3 is a detailed block diagram of the reference voltage compensator 15 of FIG. 1. According to a preferred embodiment, the reference voltage compensator 15 includes an error detector 41 and a compensation value generator 71.

FIGS. 4A through 4C show waveforms for describing the asymmetry of the RF signal shown in FIG. 1. FIG. 4A shows a case where the DC voltage of the RF signal is equal to the reference voltage (Vref). FIG. 4B shows a case where the DC voltage of the RF signal is not equal to the reference voltage (Vref). FIG. 4C shows an up/down asymmetrical signal.

The error detector 41 shown in FIG. 3 receives the asymmetry compensation signal S(n) generated by the adder 13 (refer to FIG. 1), delays the asymmetry compensation signal S(n) by 1T and 2T, where T is one period of the recovery clock signal, and obtains a first delay signal S(n−1) and a second delay signal S(n−2). When the absolute value of the obtained first delay signal S(n−1) is smaller than a first threshold value (V1), an error value is obtained by adding the signal S(n) to the signal S(n−2) and a cumulatively added error value is obtained by adding one or more successive error values to each other. Referring to FIG. 4, when the DC voltage of the RF signal is equal to the reference voltage (Vref) as shown in FIG. 4A, the value of S(n) is −K and the value of S(n−2) is +K, the absolute values of which are the same. Therefore, the error value obtained by adding the signal S(n) to the signal S(n−2) becomes zero. However, when the DC voltage of the RF signal is not equal to the reference voltage (Vref), the absolute value of S(n) is different to that of S(n−2). Therefore, when the signal S(n) is added to the signal S(n−2), an arbitrary error value is generated. According to a preferred embodiment, the asymmetry of the RF signal is compensated for, using the fact that the DC voltage of the RF signal is not equal to the reference voltage (Vref) when the value obtained by adding the signal S(n) to the signal S(n−2) is not zero. A first threshold value (V1) for detecting the point in time at which the RF signal crosses the reference voltage (Vref) is designated as K/2.

Preferably, the error detector 41 includes delayers 43 and 45, adders 47 and 55, a comparator 59, buffers 51 and 53, switch 49, a counter 61, and a divider 63. In the present embodiment, it is assumed that the error detector 41 detects a cumulatively added error value by adding two successive error values using the buffers 51 and 53.

The first delayer 43 receives the asymmetry-compensated signal S(n), delays the asymmetry-compensated signal S(n) by 1T and generates the delayed signal as first delay signal S(n−1). The second delayer 45 receives the first delay signal, delays the first delay signal by 1T, and generates the delayed signal as second delay signal S(n−2). The comparator 59 receives the first delay signal and the first threshold value (V1), determines whether the absolute value of the first delay signal is smaller than the first threshold value (V1), and outputs a signal (N1), which is enabled when the absolute value of the first delay signal is smaller than the first threshold value (V1), to the adder 47 and the clock terminal of the counter 61. Here, the first threshold value (V1) is an arbitrary value approximately equal to the reference voltage (Vref). A method of determining the first threshold value (V1) will be described hereinafter. The comparator 59 compares the first delay signal S(n−1) with the first threshold value (V1) and detects the point in time at which the first delay signal S(n−1) passes the reference voltage (Vref). The counter 61 counts the number of times the asymmetry compensation signal S(n) crosses the reference voltage (Vref) by counting the signal (N1) generated by the comparator 59 and generates the least significant bit (LSB) of the counted value as a first control signal CS1 for controlling the switching operation of the switch 49. The divider 63 generates the remainder obtained by dividing the counted value generated by the counter 61 by two as a second control signal CS2 for controlling the switching operation of the switch 57.

The adder 47 adds the asymmetry compensated signal S(n) to the second delay signal S(n−2) in response to the signal N1 output from the comparator 59 and generates the addition result as the error value. The switch 49 transmits the error value generated by the adder 47 to the first buffer 51 or the second buffer 53 in response to the first control signal CS1. Thus the error values are stored in the buffers 51 and 53. The adder 55 adds the values stored in the buffers 51 and 53 and outputs the addition value to the compensation value generator 71 as the cumulatively added error value. As a result, the error detector 41 shown in FIG. 3 adds two successively generated error values using the switch 49, the buffers 51 and 53, and the adder 55 and generates the addition result as a cumulatively-added error value.

The compensation value generator 71 shown in FIG. 3 up- or down-counts the recovery clock signal PLCK according to the sign of the cumulatively added error value which is generated by the error detector 41 and the second control signal CS2, generates a first voltage compensation value EV1 when the counted value becomes equal to a positive second threshold value +V2, and generates a second voltage compensation value EV2 whose magnitude is equal to that of the first voltage compensation value and whose sign is opposite to that of the first voltage compensation value when the counted value becomes equal to the negative second threshold value −V2. The compensation value generator 71 preferably includes a sign comparator 73, an up/down counter 75, a switch 57, and a comparator 77.

The sign comparator 73 detects whether the sign of the cumulatively added error value received from the switch 57 of the error detector 41 is positive (+) or negative (−) and outputs the detection result to the switch 75. The switch 57 is turned on or off in response to the second control signal CS2. The up/down counter 75 up or down counts the recovery clock signal PLCK according to the detection result which is generated in response to the switching operation of the switch 57. The up/down counter is reset by a reset signal R. For example, the up/down counter 75 up counts the recovery clock signal PLCK when the detection result from the sign comparator 73 has a positive sign and down counts the recovery clock signal PLCK when the detection result has a negative sign. The comparator 77 compares the value counted to by the up/down counter 75 with the second threshold value V2 and outputs the reference voltage compensation value EV corresponding to the comparison result. For example, the comparator 77 generates −1 when the value counted to by the up/down counter 75 is the positive second threshold value +V2, and +1 when the value counted to by the up/down counter 75 is the negative second threshold value −V2, as the reference compensation value EV which is output to the adder 13 of the apparatus shown in FIG. 1 and outputs the reset signal R for resetting the up/down counter 75. Namely, the adder 13 compensates for the DC voltage of the signal A(n) so that the DC voltage is equal to the reference voltage Vref by adding +1 or −1 to the signal A(n) generated by the ADC 11.

The reference voltage compensation value EV of +1 or −1, corresponds to one step between adjacent quantization levels when the ADC 11 shown in FIG. 1 digitally converts the RF signal. For example, when the compensation value generator 71 outputs +1 to the adder 13, the level of the signal A(n) is increased by one quantization step. When the compensation value generator 71 outputs −1 to the adder 13, the level of the signal A(n) is lowered by one quantization step. Accordingly, the DC voltage of the signal A(n) is compensated for so that the DC voltage becomes equal to the reference voltage Vref.

The asymmetry compensator 33 according to the preferred embodiment generates the voltage compensation value EV corresponding to the sign of the error value, thus correctly compensating for the asymmetry of the RF signal, using the characteristic that the error value is not "0" when an RF signal having asymmetry is received.

Figure 5:
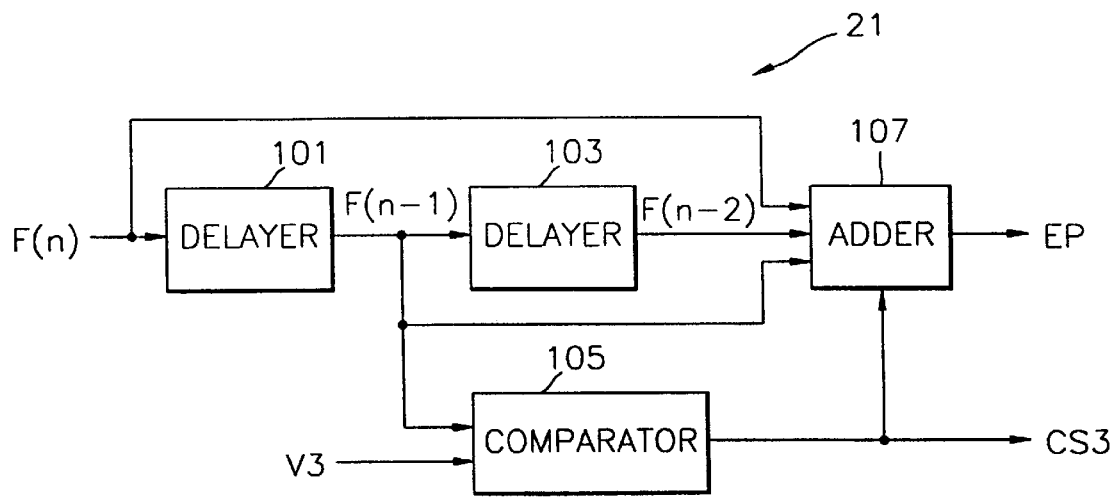
FIG. 5 is a detailed block diagram of the phase error detector of FIG. 1 in accordance with the present invention.

FIG. 5 shows the phase error detector 21 of FIG. 1 in detail. The phase error detector 21 includes delayers 101 and 103, a comparator 105, and an adder 107.

The delayer shown in FIG. 5 receives the digital RF signal F(n) from the digital filter 17 shown in FIG. 1, generates a third delay signal F(n−1) by delaying the received digital RF signal by 1T, and outputs the third delay signal F(n−1) to the delayer 103, the adder 107, and the comparator 105. The delayer 103 generates a fourth delay signal F(n−2) by delaying the third delay signal F(n−1) by 1T and outputs the fourth delay signal F(n−2) to the adder 107.

The comparator 105 receives the third delay signal F(n−1) from the delayer 101 and outputs a third control signal CS3, which is enabled when the absolute value of the third delay signal F(n−1) is smaller than a third threshold value V3 around the reference voltage Vref, to the adder 107, the control voltage generator 23 (refer to FIG. 1), and the adaptive controller 25 (refer to FIG. 1). The third threshold value V3 for detecting the point in time at which the RF signal crosses the reference voltage Vref, may be designated as the same value as the first threshold value V1. The adder 107 receives the digital RF signal F(n), the third delay signal F(n−1) from the delayer 101, and the fourth delay signal F(n−2) from the delayer 103, and adds the received signals to each other in response to the third control signal CS3. The addition result obtained by the adder 107 is output as a phase error EP.

Figure 6:
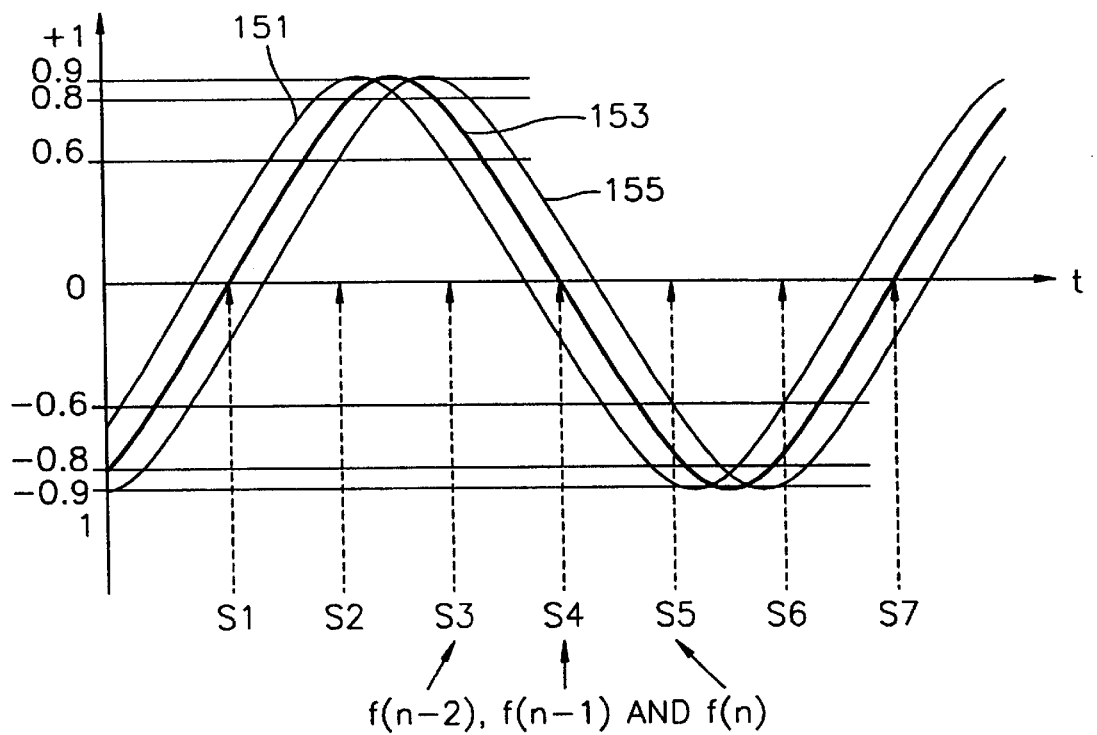
FIG. 6 are waveforms of RF signals having various phases based on a recovery clock signal (PLCK).

FIG. 6 shows RF signals having various phases based on the recovery clock signal PLCK. In a first waveform 151, the phase of the RF signal leads that of the recovery clock signal PLCK. In this case, the phase of the recovery clock signal PLCK should be locked to that of the RF signal by controlling the phase of the recovery clock signal PLCK to lead. In a second waveform 153, the phase of the RF signal is locked to that of the recovery clock signal PLCK. In a third waveform 155, the phase of the RF signal lags that of the recovery clock signal PLCK. In this case, the phase of the recovery clock signal PLCK should be locked to the phase of the RF signal by controlling the phase of the recovery clock signal PLCK to lag.

Table 1 shows an example of sampling values generated when the first through third waveforms 151, 153, and 155 shown in FIG. 6 are respectively sampled by the recovery clock signal PLCK. Table 2 shows phase relationships between the RF signal and the recovery clock signal PLCK according to the phase error EP of the first through third waveforms 151, 153, and 155 obtained by the adder 107 shown in FIG. 5.

TABLE 1

| Classification | S1 | S2 | S3 f(n−2) | S4 f(n−1) | S5 f(n) | S6 | S7 |
| --- | --- | --- | --- | --- | --- | --- | --- |
| First waveform | 0.2 | 0.9 | 0.6 | −0.2 | −0.9 | −0.6 | 0.2 |
| Second waveform | 0 | 0.8 | 0.8 | 0 | −0.8 | −0.8 | 0 |
| Third waveform | −0.2 | 0.6 | 0.9 | 0.2 | −0.6 | −0.9 | −0.2 |

TABLE 2

| Classification | Phase error = f(n−2) + f(n−1) + f(n) | Phase relationship between RF signal and PLCK | Magnitude of actual phase error |
| --- | --- | --- | --- |
| First waveform | Negative EP = −5 | The phase of PLCK lags. | In proportion to \|EP\| |
| Second waveform | 0 | The phase of RF signal is locked to that of PLCK. | 0 |
| Third waveform | Positive EP = 5 | The phase of PLCK leads. | In proportion to \|EP\| |

Referring to FIG. 6 and Table 1, the phase error EP, which is obtained by adding f(n−2), f(n−1) and f(n) to each other, of the first through third waveforms 151, 153, and 155 are respectively −0.5, 0, and 0.5.

Referring to Table 2, in the case where the phase of the recovery clock signal PLCK lags that of the RF signal like in the first waveform 151, the phase error EP has a negative (−) value. In the case where the phase of the recovery clock signal PLCK leads that of the RF signal like in the third waveform 155, the phase error EP has a positive (+) value. In the case where the phase of the recovery clock signal PLCK is locked to that of the RF signal like in the second waveform 153, the phase error EP becomes 0. Also, the magnitude of the actual phase error between the RF signal and the recovery clock signal PLCK is proportional to the absolute value of the phase error EP. The phase relationship between the recovery clock signal PLCK and the RF signal and the magnitude of the phase error between the recovery clock signal PLCK and the RF signal are determined by the phase error EP generated by the apparatus shown in FIG. 5.

Figure 7:
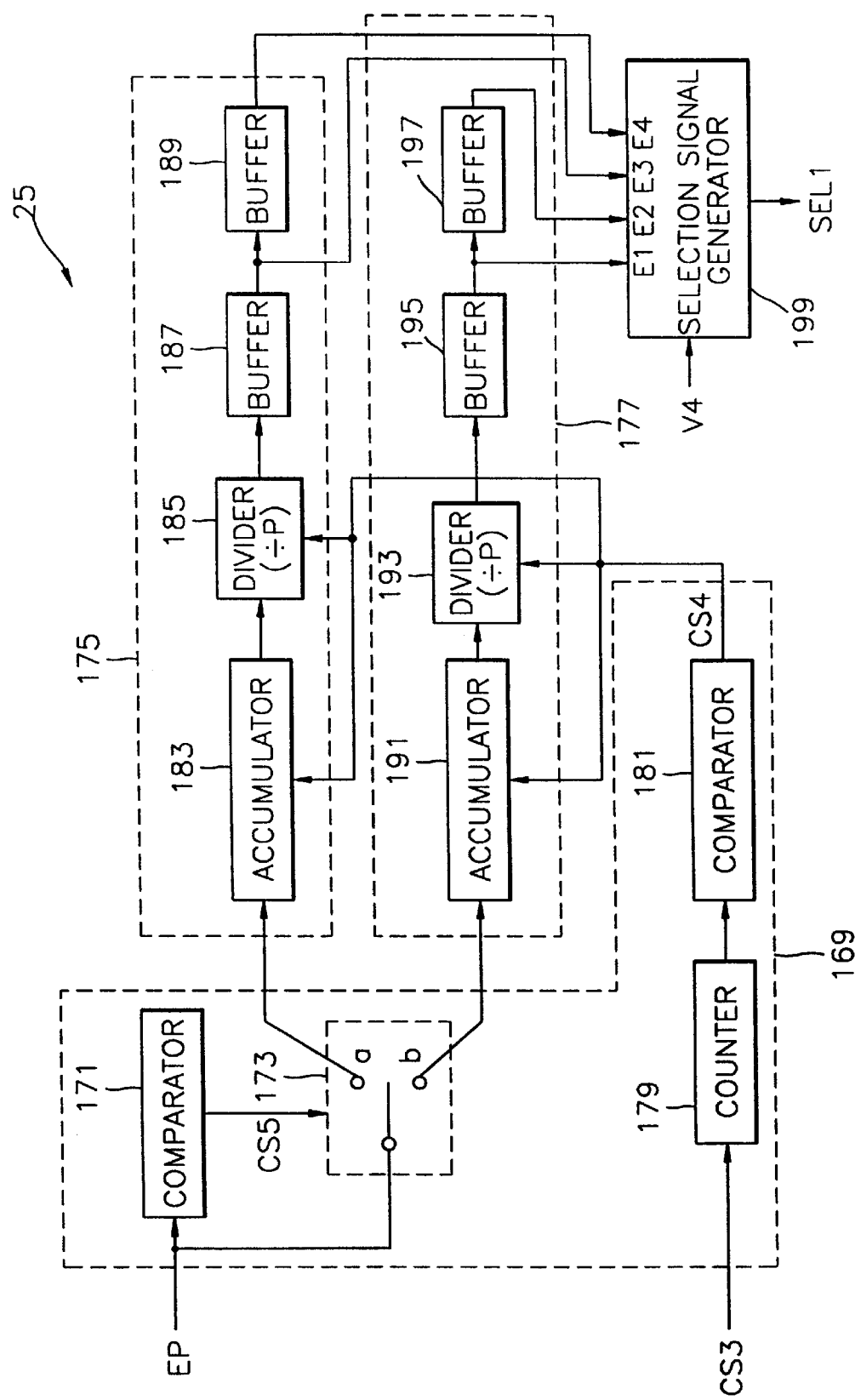
FIG. 7 is a detailed block diagram of the adaptive controller of FIG. 1 in accordance with the present invention.

FIG. 7 is a detailed block diagram of the adaptive controller 25 of FIG. 1. The adaptive controller 25 includes a control signal generator 169, first and second mean error value generators 175 and 177, and a selection signal generator 199.

The control signal generator 169 counts the number of times the digital RF signal crosses the reference voltage Vref by counting the third control signal CS3 generated by the phase error detector 21, and generates a fourth control signal CS4 enabled when the number of crossings of Vref reaches P, where P is a natural number equal to or larger than 1. The control signal generator 169 preferably includes comparators 171 and 181, a switch 173, and a counter 179.

The comparator 171 receives the phase error EP generated by the phase error detector 21 and determines whether the received phase error EP is larger than 0. The comparator 171 outputs the comparison result as a fifth control signal CS5 to the switch 173. The switch 173 is switched to the terminal a when the phase error EP is larger than 0 and to the terminal b when the phase error EP is smaller than 0, in response to the fifth control signal CS5. The counter 179 counts the number of times the digital RF signal F(n) crosses the reference voltage Vref by counting the third control signal CS3 generated by the error detector 21 and outputs the counted value to the comparator 181. The counter 179 is reset when the counted value is P and then continues to count the third control signal (CS3 ). The comparator 181 determines whether the value counted by the counter 179 has reached P and generates the fourth control signal CS4 when the counted value is equal to P.

The first mean error value generator 175 cumulatively adds the phase error EP larger than 0 by the switching operation of the switch 173 responsive of the fifth control signal CS5. The first mean error value generator 175 divides the cumulatively-added value by P in response to the fourth control signal CS4 and obtains the mean value of the phase error EP larger than 0 whenever the digital RF signal crosses the reference voltage Vref P times. The second mean error value generator 177 cumulatively adds the phase error EP smaller than 0 by the switching operation of the switch 173 which responds to the fifth control signal CS5. The second mean error value generator 177 divides the cumulatively added value by P in response to the fourth control signal CS4 and obtains the mean value of the phase error EP smaller than 0 whenever the digital RF signal crosses the reference voltage Vref P times. The first mean error value generator 175 preferably includes an accumulator 183, a divider 185, and buffers 187 and 189. The second mean error value generator 177 preferably includes an accumulator 191, a divider 193, and buffers 195 and 197.

The accumulator 183 of the first mean error value generator 175 receives positive phase error EP from the switch 173 and cumulatively adds the positive phase error EP received while the counter value of the counter 179 reaches P. When the counter value of the counter 179 reaches P, the accumulator 183 outputs the cumulatively added value to the divider 185 and is reset in response to the fourth control signal CS4. The divider 185 receives the positive phase error EP from the accumulator 183 in response to the fourth control signal CS4, divides the received phase error EP by P, obtains the quotient as the mean error value, and outputs the mean error value to the buffer 187. Namely, the divider 185 generates the mean error value, for every period of time in which the digital RF signal makes P crossings of the reference voltage Vref, in response to the fourth control signal CS4. The buffers 187 and 189 store the mean error values successively generated by the divider 185 as third and fourth error mean values E3 and E4 respectively.

The accumulator 191 in the mean value generator 177 receives negative phase error EP from the switch 173 and cumulatively adds the negative phase error EP received while the counter value of the counter 179 reaches P. Since the operations of the accumulator 191 and the divider 193 hereinafter are the same as those of the accumulator 183 and the divider 185 of the first mean error value generator 175, detailed descriptions thereof will be omitted. The buffers 195 and 197 store the mean error values successively generated by the divider 193 as first and second mean error values E1 and E2 respectively.

The selection signal generator 199 receives the first, second, third, and fourth mean error values E1, E2, E3, and E4 respectively stored in the buffers 195, 197, 187, and 189, and compares the magnitudes of their absolute values with a fourth threshold value V4, and generates a pulse width selection signal SEL1 according to the comparison result.

Figure 8:
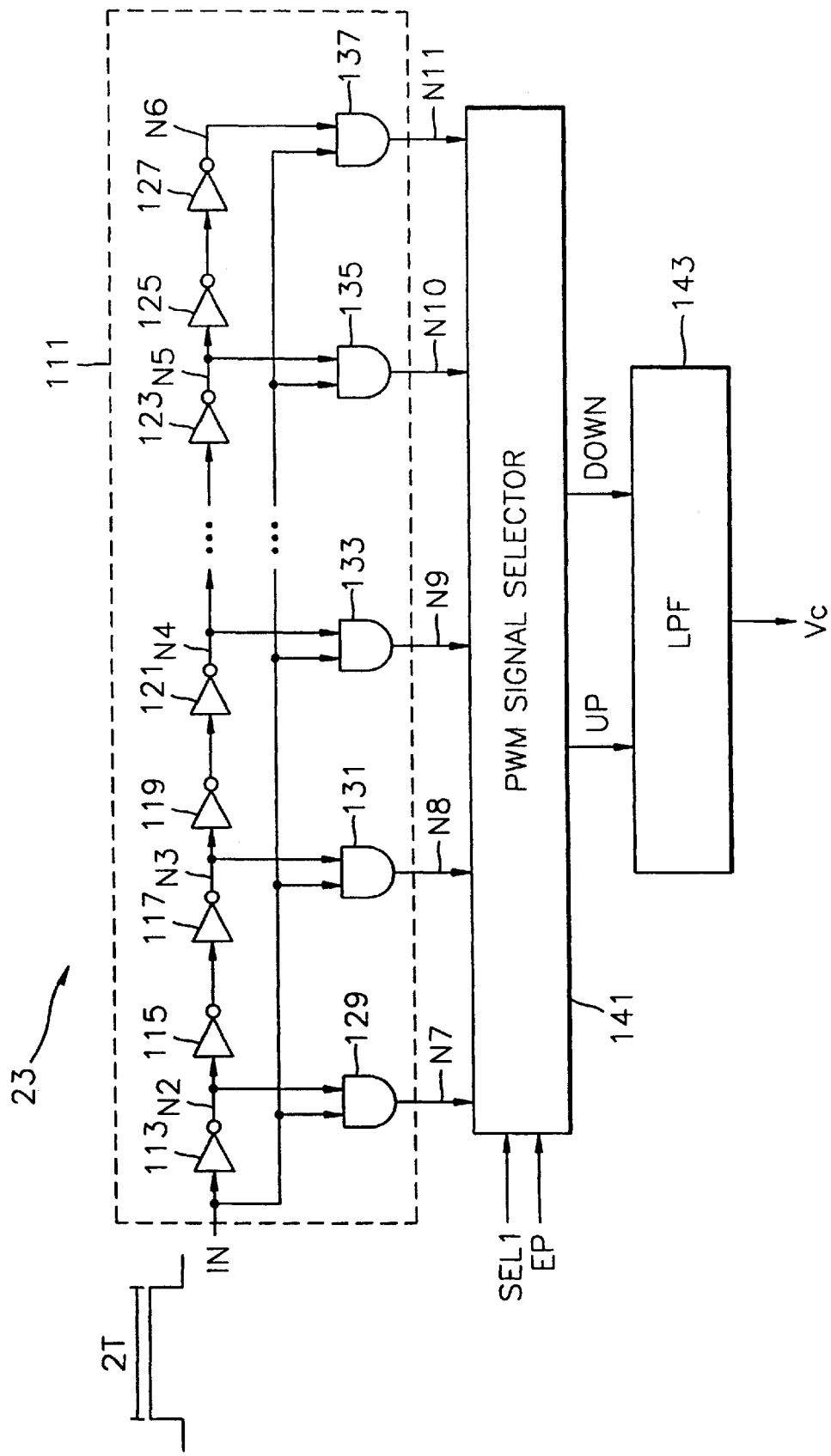
FIG. 8 is a detailed schematic diagram of the control voltage generator of FIG. 1 in accordance with the present invention.

FIG. 8 is a detailed schematic diagram of the control voltage generator 23 of FIG. 1. The control voltage generator 23 includes a PWM signal generator 111, a PWM signal selector 141, and a low pass filter 143.

The PWM signal generator 111 shown in FIG. 8 receives a pulse signal PULSE whose pulse width is 2T through the input terminal IN and generates a plurality of PWM signals. The PWM signal generator 111 preferably includes first through nth inverters 113 through 127 and first through mth AND gates 129 through 137.

The first through nth inverters 113 through 127, which have the same delay time D and are serially connected, generate delay signals obtained by delaying the pulse signal input to the first inverter 113. The first through mth AND gates 129 through 137 perform an AND operation on signals N2 through N6 respectively, output from odd numbered inverters and the pulse signal, and generate the AND operation result as first through mth PWM signals N7 through N11. Namely, the first inverter 113 inverts the pulse signal input through the input terminal IN and delays the same for a delay time D. The first AND gate 129 generates the first PWM signal N7 having a pulse width which is one time the delay time D by performing an AND operation on the pulse signal and the output signal of the first inverter 113. Also, the third inverter 117 inverts the pulse signal input through the input terminal IN with the delay time 3D. The second AND gate 131 generates the second PWM signal N8 having the pulse width which is three times the delay time D by performing an AND operation on the pulse signal and the output signal of the third inverter 117. Finally, the nth inverter 127 inverts the pulse signal input through the input terminal IN with the delay nD, where n is an inverter. The mth AND gate 137 generates the mth PWM signal N11 having a pulse width which is n times the delay time of the first inverter by performing the AND operation on the pulse signal and the output signal of the nth inverter 127.

The PWM signal generator 141 selects one PWM signal among the first through mth PWM signals N7 through N11 corresponding to the phase error EP generated by the phase error detector 21 shown in FIG. 1 and the pulse width selection signal SEL1 generated by the adaptive controller 25. The PWM signal selector 141 outputs the selected PWM signal to the low pass filter 143 as the up signal UP or the down signal DOWN, according to the sign of the phase error EP. For example, when the phase error EP has a positive (+) sign, the phase of the current recovery clock signal PLCK leads that of the RF signal. Therefore, the PWM signal selector 141 outputs the PWM signal selected by the pulse width selection signal SEL1 as the down signal DOWN to the low pass filter 143 so as to delay the phase of the recovery clock signal PLCK. When the phase error EP has a negative sign, the phase of the current recovery clock signal PLCK lags that of the RF signal. Therefore, the PWM signal selector 141 outputs the PWM signal selected by the pulse width selection signal SEL1 as the up signal UP to the low pass filter 143 so as to advance the phase of the recovery clock signal PLCK.

The low pass filter 143 receives the up signal UP or the down signal DOWN output from the PWM signal selector 141, low-pass-filters the received signal, and outputs the low-pass-filtered signal as the control voltage Vc for controlling the frequency and phase of the voltage controlled oscillator 27 shown in FIG. 1.

The operations of the selection signal generator 199, the adaptive controller 25, and the control voltage generator 23 will now be described in more detail with reference to Table 3.

TABLE 3

| Classification | E1 | E2 | E3 | E4 | Voltage control strength |
|---|---|---|---|---|---|
| First case | $|E1|<V4$ | $|E2|<V4$ | $|E2|<V4$ | $|E4|<V4$ | Maintained or lowered |
| Second case | $|E1|>V4$ | $|E2|>V4$ | $|E3|<V4$ | $|E4|<V4$ | Up |
| Third case | $|E1|<V4$ | $|E2|<V4$ | $|E3|>V4$ | $|E4|>V4$ | Up |
| Fourth case | $|E1|>V4$ | $|E2|>V4$ | $|E3|>V4$ | $|E4|>V4$ | lowered |

In Table 3, $|E1|$, $|E2|$, $|E3|$, and $|E4|$ respectively represent the absolute values of the first, second, third, and fourth mean error values E1, E2, E3, and E4.

In the first case, when all the absolute values of the first through fourth mean error values E1 through E4 input to the selection signal generator 199 are smaller than the fourth threshold value V4, the phase of the RF signal is made to nearly coincide with that of the recovery clock signal PLCK. Namely, the fourth threshold value V4 corresponds to the allowable range of phase error between the RF signal and the recovery clock signal PLCK. In the first case, all the absolute values of the first through fourth mean error values E1 through E4 exist within the allowable error range. When the first through fourth mean error values E1 through E4 are smaller than the fourth threshold value V4, the level of the control voltage should be maintained or lowered so that the frequency/phase of the current recovery clock signal PLCK are maintained. Namely, the selection signal generator 199 generates a pulse width selection signal SEL1 so that the level of the control voltage Vc, generated by the control voltage generator 23 shown in FIG. 1 is maintained or lowered. Here, lowering the level of the control voltage Vc means the pulse width of a PWM signal is made smaller than that of the current PWM signal.

In the second case of Table 3, the first and second mean error values E1 and E2 are larger than the fourth threshold value V4 and the third and fourth mean error values E3 and E4 are smaller than the fourth threshold value V4. In such a case, the phase of the recovery clock signal PLCK is maintained to lead that of the RF signal since the strength of the down signal DOWN for reducing the frequency of the recovery clock signal PLCK so that the phase of the current recovery clock signal PLCK lags is low. Therefore, the selection signal generator 199 generates the pulse width selection signal SEL1 for increasing the strength of the down signal DOWN in order to quickly lock the phase of the recovery clock signal PLCK to that of the RF signal. Here, increasing the strength of the down signal DOWN means that the pulse width of the PWM signal is made larger than that of the current PWM signal.

In the third case of Table 3, the first and second mean error values E1 and E2 are smaller than the fourth control value V4 and the third and fourth mean error values E3 and E4 are larger than the fourth threshold value V4. In such a case, the phase of the recovery clock signal PLCK is maintained to lag that of the RF signal since the strength of the up signal UP for increasing the frequency of the recovery clock signal PLCK so that the phase of the current recovery clock signal PLCK leads is low. Therefore, the selection signal generator 199 generates the pulse width selection signal SEL1 for increasing the strength of the up signal UP, in order to quickly lock the phase of the recovery clock signal PLCK to that of the RF signal. Here, increasing the strength of the UP signal up means that the pulse width of the PWM signal is made larger than that of the current PWM signal.

In the fourth case of Table 3, each of the first through fourth error mean values E1 through E4 are larger than the fourth threshold value V4. In such a case, since the strength of the up signal UP or the down signal DOWN is high, the phase of the recovery clock signal PLCK repeatedly and alternately leads and lags that of the RF signal. Therefore, the selection signal generator 199 generates the pulse width selection signal SEL1 for decreasing the strength of the down signal DOWN and the up signal UP. Here, decreasing the strength of the down signal DOWN and the up signal UP means that the pulse width of the PWM signal is made shorter than the pulse width of the current PWM signal.

As mentioned above, the adaptive phase controller 31 according to a preferred embodiment of the present invention, continuously tracks the phase state of the current recovery clock signal PLCK and the RF signal without additional external control, using the sign of the phase error EP and the phase error mean values for a predetermined period of time (for example, the period of time during which the digital RF signal crosses the reference voltage P times), thus generating the optimal control voltage Vc.

Figure 9:
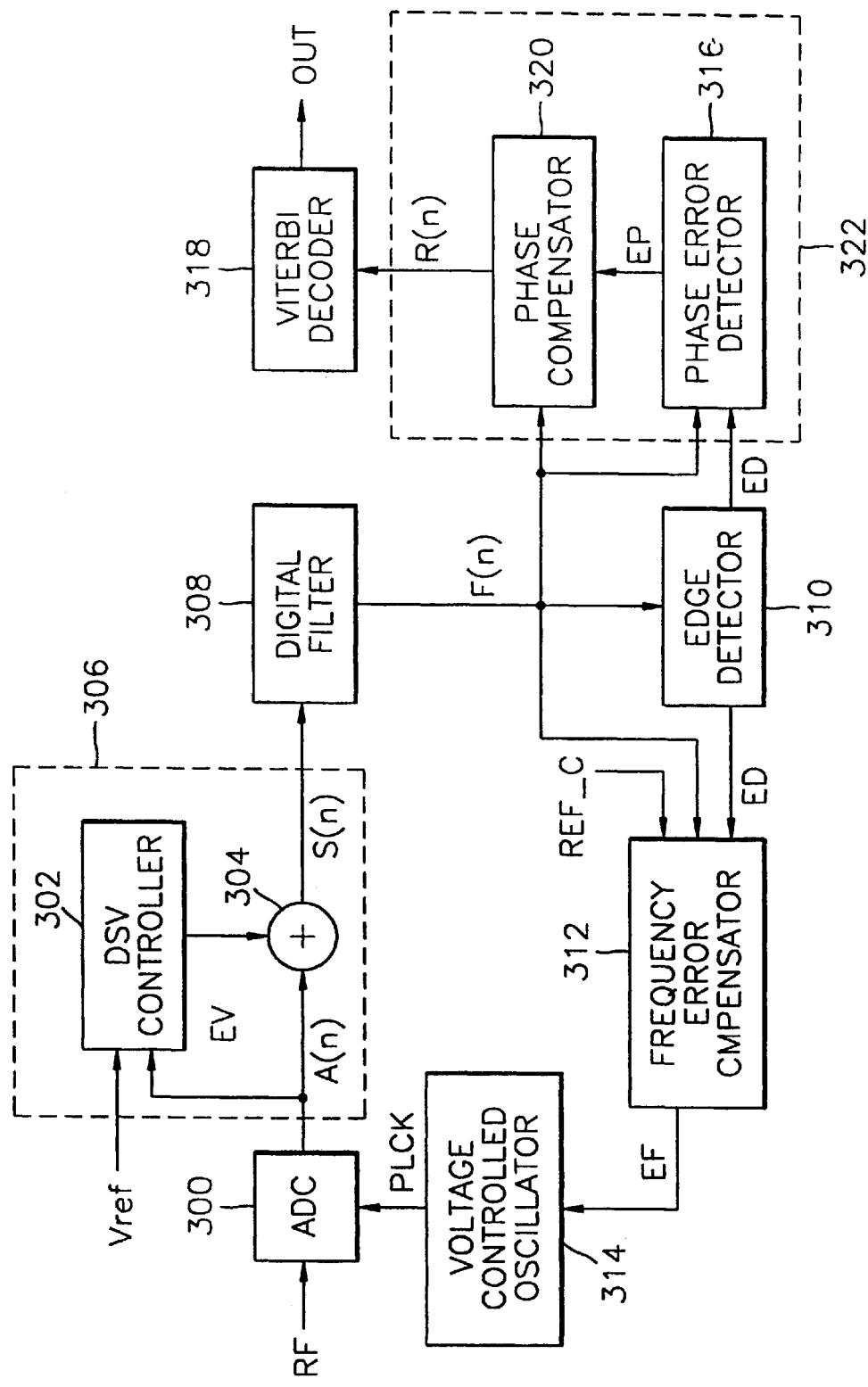
FIG. 9 is a block diagram of an apparatus for restoring data in an optical disk reproducing system according to an embodiment of the present invention.

FIG. 9 shows an apparatus for restoring data of an optical disk reproducing system according to another embodiment of the present invention. The data restoring apparatus of the optical disk reproducing system according to this embodiment of the present invention, includes an ADC 300, an asymmetry compensator 306, a digital filter 308, a viterbi decoder 318, an edge detector 310, a frequency error compensator 312, a phase error detector 322, and a voltage controlled oscillator 314.

Since the operation of the ADC 300 shown in FIG. 9 is the same as that of the ADC 11 shown in FIG. 1, a detailed description thereof will be omitted.

The asymmetry compensator 306 shown in FIG. 9 receives signals A(n) digitally converted by the ADC 300, controls the number of signals A(n) having levels higher than the reference voltage Vref to be equal to the number of the signals A(n) having levels lower than the reference voltage Vref, and outputs the signals A(n) as asymmetry compensated signals S(n) to the digital filter 308. The asymmetry compensator 306 preferably includes an adder 304 and a digital sum value (DSV) controller 302.

The DSV controller 302 receives the output signals A(n) of the ADC 300 and outputs the reference voltage compensation value EV to the adder 304 so that the number of the signals A(n) having levels higher than the reference voltage Vref is equal to that of the signals A(n) having levels lower than a compensated reference voltage Vref'. The adder adds the reference voltage compensation values EV output from the DSV controller 302 to the signals A(n) output from the ADC 300, and outputs the addition results to the digital filter 308 as the asymmetry compensated signals S(n). Namely, since the asymmetry compensator 306 obtains the reference voltage compensation values EV using the characteristic of the RF signals that the number of the signals A(n) having levels higher than the reference voltage Vref is equal to that of the signals A(n) having levels lower than the reference voltage Vref when the DC voltage of the signals A(n) is the same as the reference voltage Vref, and adds the obtained reference voltage compensation values EVs to the signals A(n), the asymmetry is compensated for so that the DC voltage of the signals S(n) output from the adder 13 is equal to the reference voltage Vref. The detailed structure and operation of the DSV controller 302 will be described hereinafter with reference to FIG. 10.

The digital filter 308 shapes the waveforms of the signals S(n) received from the adder 304 and outputs the waveform shaped digital RF signals F(n) to the edge detector 310, the frequency error compensator 312, and the phase error compensator 322. Since the advantages of using the digital filter were described in the first embodiment of the present invention, a detailed description thereof will be omitted. The edge detector 310 receives the digital RF signal F(n), detects sections in which the digital RF signal F(n) crosses the reference voltage Vref, to edge detection signals ED. The detailed structure and operation of the edge detector 310 will be described hereinafter with reference to FIG. 11.

The frequency error compensator 312 cumulatively adds a value of K in response to the recovery clock signal PLCK in sections where the edge detection signals are disabled and cumulatively adds the digital RF signals in response to the recovery clock signal PLCK in sections where the edge detection signals are enabled while the digital RF signal having the maximum duty is received in a period of a predetermined term (for example, 588T), thus counting maximum coefficient values MAX_C. The frequency error compensator 312 compares the maximum coefficient values MAX_C with reference coefficient values REF_C, generates the control voltage Vc for controlling the frequency of the recovery clock signal PLCK according to the comparison results, and locks the control voltage Vc when the maximum coefficient value MAX_C is equal to reference coefficient value REF_C. The detailed structure and operation of the frequency error compensator 312 will be described hereinafter with reference to FIG. 13.

The phase error compensator 322 obtains the phase error EP having a sign according to whether the phase of the recovery clock signal PLCK lags or leads that of the RF signal and generates phase compensated RF signal R(n) so that the phase of the recovery clock signal PLCK is locked to that of the digital RF signal by adding the digital RF signal to and subtracting the digital RF signal from the phase error EP according to whether the digital RF signal is an increasing or a decreasing in a section where the edge detection signal ED is enabled. In more detail, the phase error compensator 322 includes a phase error detector 316 and a phase compensator 320.

The phase error detector 316 obtains the phase error EP according to whether the phase of the digital RF signal lags or leads that of the recovery clock signal PLCK F(n). The phase compensator 320 generates the phase compensated digital RF signal R(n) by subtracting the phase error ED from the digital RF signal F(n) when the digital RF signal is decreasing in a section where the edge detection signal ED is enabled and adding the phase error ED to the digital RF signal when the digital RF signal is increasing and outputs the phase compensated digital RF signal R(n) to the viterbi decoder 318. The detailed structures and operations of the phase error detector 322 and the phase compensator 320 will be described hereinafter with reference to FIGS. 16 and 18.

In this embodiment, the phase error compensator 322 does not control the voltage controlled oscillator 314 in order to lock the phase of the recovery clock signal PLCK to that of the RF signal. Therefore, it is possible to remove the instability caused by varying the frequency of the recovery clock signal PLCK in order to lock the phase of the recovery clock signal to that of the RF signal.

The viterbi decoder 318 receives the phase-compensated RF signal R(n) generated by the phase compensator 320, decodes the phase-compensated RF signal R(n), and outputs the decoded bit stream as restored data to the output terminal OUT.

Figure 10:
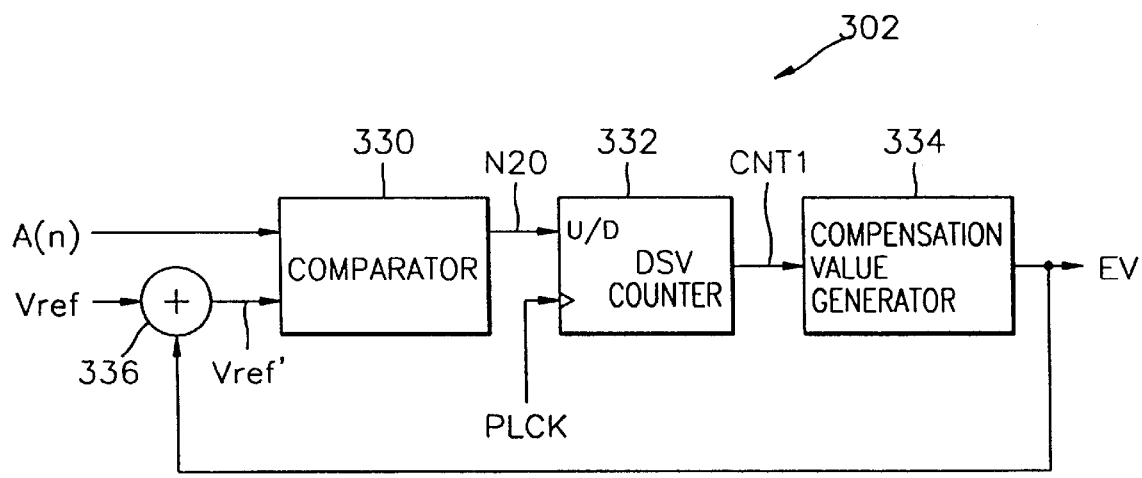
FIG. 10 is a detailed schematic diagram of the digital sum value (DSV) controller of FIG. 9 in accordance with the present invention.

FIG. 10 is a detailed block diagram of the DSV controller 302 of FIG. 9. The DSV controller 302 includes an adder 336, a comparator 330, a DSV counter 332, and a compensation value generator 334.

The adder 336 shown in FIG. 10 generates the compensated reference voltage Vref' by adding the reference voltage Vref to the reference voltage compensation value EV. The comparator 330 compares the magnitude of the digitally converted signal A(n) generated by the ADC 300 with that of the compensated reference voltage Vref' and generates a first enable signal N20 according to the comparison result. The DSV counter 332 up counts the recovery clock signal PLCK when the signal A(n) is larger than the compensated reference voltage Vref' as the comparison. The DSV counter 332 down counts the recovery clock signal PLCK when the voltage of the signal A(n) is smaller than the compensated reference voltage Vref' and generates the counting result as a DSV count value CNT1.

Also, the DSV counter 332 is reset after generating a first compensation value such as −1 when the DSV count value CNT1 becomes a positive (+) fifth threshold value +V5 or after generating a second compensation value such as +1 whose magnitude is the same as that of the first compensation value and whose sign is opposite to that of the first compensation value when the DSV count value CNTI becomes a negative (−) fifth threshold value −V5. The compensation value generator 334 cumulatively adds the first or second compensation value generated by the DSV counter 332 to obtain the cumulatively added value, the reference voltage compensation value EV. Since the adder 304 adds the signal A(n) generated by the ADC 11 to the reference voltage compensation value EV, the adder 304 compensates for the signal A(n) so that the DC voltage of the signal A(n) is equal to the reference voltage Vref.

The first or second compensation value of +1 or −1, corresponds to one step between adjacent quantization levels when the ADC 300 shown in FIG. 9 digitally converts the RF signal. For example, when the compensation value generator 334 outputs +1 to the adder 304, the level of the signal A(n) is increased by one quantization step. When the compensation value generator 71 outputs −1 to the adder 13, the level of the signal A(n) is lowered by one quantization step. Accordingly, the signal A(n) is compensated for so that the DC voltage of the signal A(n) is equal to the reference voltage Vref.

Figure 11:
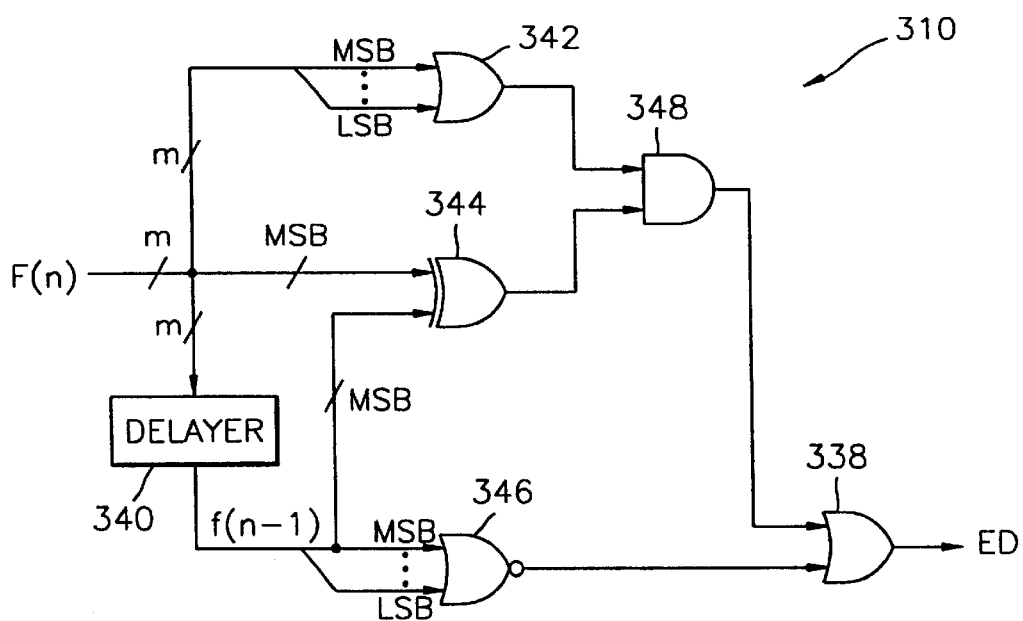
FIG. 11 is a detailed schematic diagram of the edge detector of FIG. 9 in accordance with the present invention.

FIG. 11 is a detailed block diagram of the edge detector 310 of FIG. 9. The edge detector 310 includes a delayer 340, an exclusive OR gate 344, OR gates 342 and 338, a NOR gate 346, and an AND gate 348.

The delayer 340 generates a first delay signal F(n−1) by delaying the m bit digital RF signal F(n) generated by the digital filter 308 by 1T and outputs the first delay signal F(n−1) to the NOR gate 346. The OR gate 342 performs an OR operation on all bits of the signal F(n) generated by the digital filter 308 and outputs the OR operation result to the AND gate 348. The exclusive OR gate 344 performs an exclusive OR operation on the most significant bit (MSB) of the first delay signal generated by the delayer 340 and the MSB of the digital RF signal F(n) and outputs the exclusive OR operation result to the AND gate 348. The AND gate 348 receives the signals output from the OR gate 342 and the exclusive OR gate 344, performs an AND operation on the signals, and outputs the AND operation result to the OR gate 338. The NOR gate 346 performs an inverted OR operation on all bits of the signal F(n−1) generated by the delayer 340 and outputs the result to the OR gate 338. The OR gate 338 receives the signals output from the AND gate 348 and the NOR gate 346, and performs the OR operation on the signals, and outputs the result as the edge detection signal ED.

FIGS. 12A and 12B show the generation of the edge detection signal ED according to the RF signal. FIG. 12A shows an RF signal whose frequency and phase are locked to those of the recovery clock signal PLCK. FIG. 12B shows the edge detection signal ED which detects the edge of the RF signal by the circuit shown in FIG. 11 when the frequency and phase of the recovery clock signal PLCK are locked to those of the RF signal. FIG. 12C shows an RF signal whose frequency and phase are not locked to those of the recovery clock signal PLCK. FIG. 12D shows the edge detection signal ED which detects the edge of the RF signal by the circuit shown in FIG. 11 when the frequency and phase of the recovery clock signal PLCK are not locked to those of the RF signal.

Figure 13:
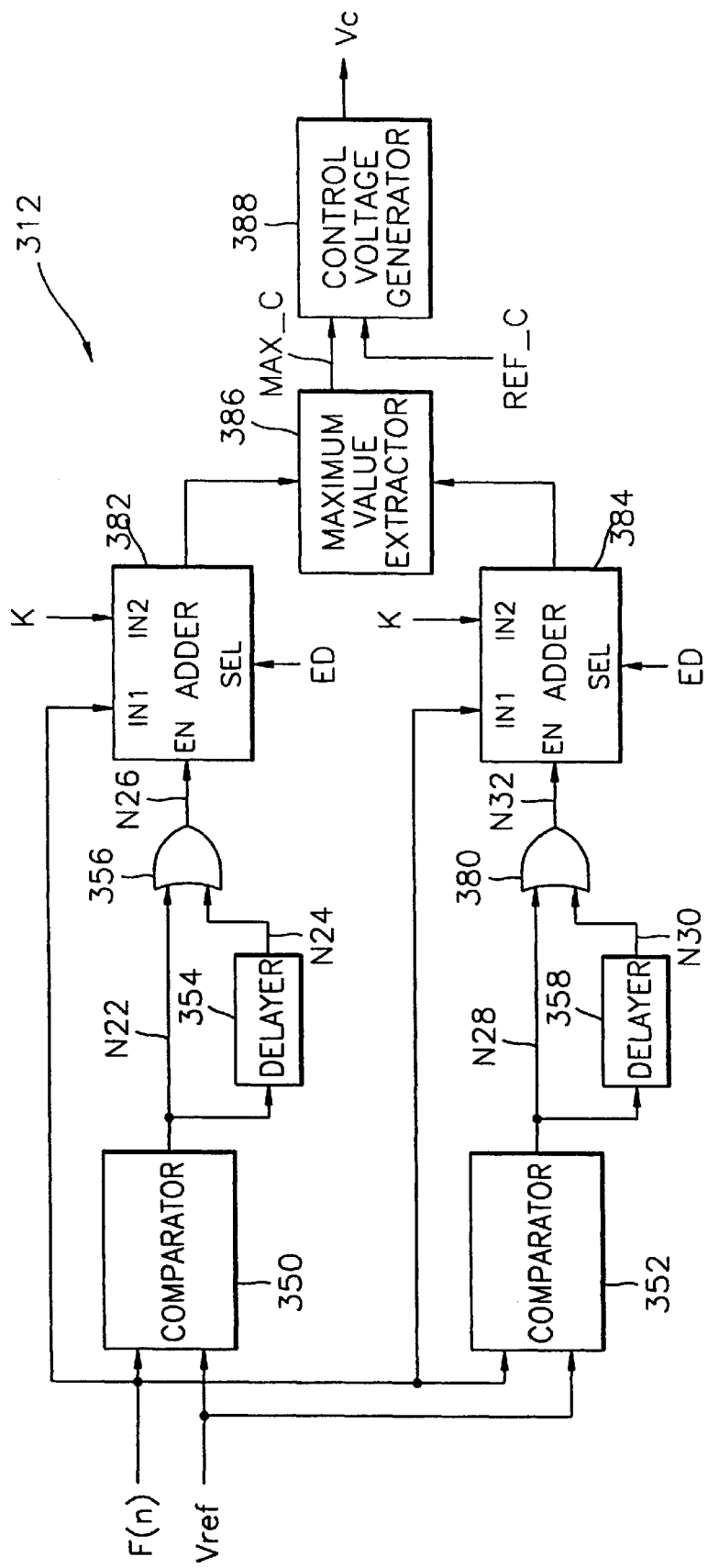
FIG. 13 is a detailed block diagram of the frequency error compensator of FIG. 9 in accordance with the present invention.

FIG. 13 is a detailed block diagram of the frequency error compensator 312 of FIG. 9. The frequency error compensator 312 includes comparators 350 and 352, delayers 354 and 358, OR gates 356 and 380, counters 382 and 384, a maximum value extractor 386, and a control voltage generator 388.

The comparator 350 shown in FIG. 13 compares the magnitude of the digital RF signal F(n) generated by the digital filter 308 with the magnitude of the reference voltage Vref and generates a signal N22 enabled when the voltage of the digital RF signal is higher than the reference voltage Vref. The delayer 354 generates a delay signal N24 obtained by delaying the signal N22 generated by the comparator 350 by 1T. The OR gate 356 performs an OR operation on the signal N22 generated by the comparator 350 and the signal N24 generated by the delayer 354 and outputs the result as a second enable signal N26 to the enable terminal of the adder 382. The adder 382 respectively receives F(n) and K via the input terminals IN1 and IN2 and is enabled according to the second enable signal N26. Here, since the definition of K was mentioned above, a description thereof will be omitted. When the adder 382 is enabled, the input terminal of the adder 382 is selected according to the edge detection signal ED input to the selection terminal SEL. For example, when the edge detection signal ED is disabled, the adder 382 selects K input to the input terminal IN2, cumulatively adds the value of K. When the edge detection signal ED is enabled, the edge detection signal selects F(n) input to the input terminal IN1 or F(n−1) obtained by delaying F(n) by 1T and cumulatively adds the value of F(n) or F(n−1). The adder 382 selects F(n) or F(n−1) according to the number of the activation of the edge detection signal ED while the adder 382 is enabled. Namely, the adder 382 cumulatively adds the value of F(n) when the edge detection signal ED is firstly enabled while the adder 382 is enabled. The adder 382 cumulatively adds the value of F(n−1) when the edge detection signal ED is secondly enabled while the adder 382 is enabled.

The comparator 352 compares the magnitude of the digital RF signal F(n) generated by the digital filter 308 (FIG. 9) with the magnitude of the reference voltage Vref and generates a signal N28 enabled when the voltage of the digital RF signal is lower than the reference voltage Vref. The delayer 358 generates a delay signal N30 obtained by delaying the signal N28 generated by the comparator 352 by 1T. The OR gate 380 performs an OR operation on the signal N28 generated by the comparator 352 and the signal N30 generated by the delayer 358 and outputs the result as a third enable signal N32 to the enable terminal of the adder 384. The adder 384 respectively receives F(n) and K via the input terminals IN1 and IN2 and is enabled according to the third enable signal N32. When the adder 384 is enabled, the adder 384 selects the input terminal thereof according to the edge detection signal ED input to the selection terminal SEL. For example, when the edge detection signal ED is disabled, the adder 384 selects K input to the input terminal IN2, and cumulatively adds the value of K. The adder 384 selects F(n) input to the input terminal IN1 or F(n−1) obtained by delaying F(n) by 1T and cumulatively adds the value of F(n) or F(n−1) when the edge detection signal ED is enabled. The adder 384 selects F(n) or F(n−1) according to the number of the activation of the edge detection signal ED while the adder 384 is enabled, similar to the adder 382. Namely, the counter 584 cumulatively adds the value of F(n) when the edge detection signal ED is firstly enabled while the adder 384 is enabled. The counter 584 cumulatively adds the value of F(n−1) when the edge detection signal ED is secondly enabled while the adder 384 is enabled.

The maximum value extractor 386 extracts the maximum value among the values generated from the adders 382 and 384 to obtain the maximum duty coefficient value MAX_C in a period of a predetermined term (for example, 588T). The control voltage generator 388 subtracts a predetermined reference coefficient value REF_C from the maximum duty coefficient value MAX_C, obtains the frequency error value EF, generates the control voltage Vc corresponding to the frequency error value EF, and is locked when the frequency error value EF becomes zero (0).

Figures 14, 14A, 14B, 14C, 14D:
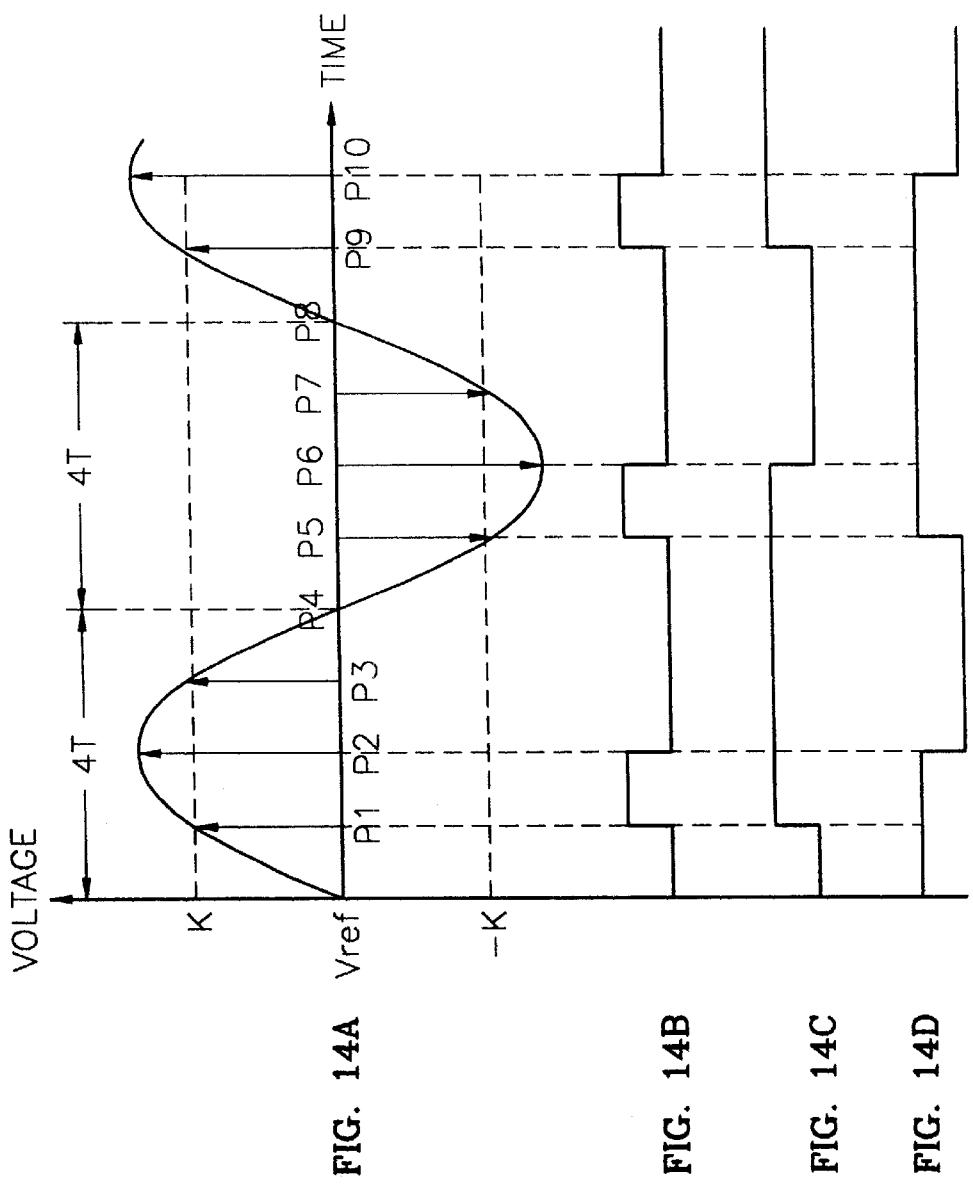
FIG. 14 is waveforms for describing the operations of the counters shown in FIG. 13 when the frequency of the recovery clock signal (PLCK) is locked to that of the RF signal.

FIGS. 14A through 14D show waveforms for describing the operations of the counters 382 and 384 shown in FIG. 13 when the frequency of the RF signal is locked to that of the recovery clock signal PLCK. FIG. 14A shows the waveform of the digital RF signal F(n). The digital RF signal F(n) has the equal duty 4T in the both side intervals where the voltage of the digital RF signal F(n) is higher and lower than that of the reference voltage, respectively. FIG. 14B shows the edge detection signal ED. FIG. 14C shows the second enable signal N26. FIG. 14D shows the third enable signal N32.

Referring to FIGS. 13 and 14, the adder 382 is enabled by the second enable signal N26 which is logic high at a point of time P1 as shown in FIG. 14C and the edge detection signal ED is enabled to logic high at the point of time P1. Since the edge detection signal ED is firstly enabled while the adder 382 is enabled, the adder 382 cumulatively adds K which is the absolute value of the digital RF signal F(n) input to the input terminal IN1. Since the edge detection signal ED is disabled at the points of time P2, P3, and P4, the adder 382 cumulatively adds the value of K input to the input terminal IN2. The edge detection signal ED is secondly enabled at a point of time P5. Therefore, the adder 382 cumulatively adds the value of F(n−1) obtained by delaying the digital RF signal F(n) by 1T. Since the value is zero, the adder 382 cumulatively adds 4 amounts of the value K while enabled. The adder 382 is disabled by the second enable signal N26 which is logic low at a point of time P6.

Also, the adder 384 is enabled by the third enable signal N32 which is logic high at a point of time P5 as shown in FIG. 15D, and the edge detection signal ED is enabled to logic high at the point of time P5. Since the edge detection signal ED is firstly enabled while the adder 384 is enabled, the adder 384 cumulatively adds K which is the absolute value of the digital RF signal F(n) input to the input terminal IN1. Since the edge detection signal ED is disabled at points of time P6, P7, and P8, the adder 384 cumulatively adds the value of K input to the input terminal IN2. The edge detection signal ED is secondly enabled at a point of time P9. Therefore, the adder 384 cumulatively adds the value of F(n−1) obtained by delaying the digital RF signal F(n) by 1T. Since the value is zero, the adder 384 cumulatively adds 4 pieces of K while enabled. The adder 384 is disabled by the third enable signal N32 which is logic low at a point of time P10.

In the case that the frequency of the RF signal is locked to that of the recovery clock signal PLCK, when the duty of the RF signal is 4T, the adder 382 or the adder 384 cumulatively adds 4 pieces of K. When the duty of the RF signal is 11T or 14T, the adder 382 or the adder 384 cumulatively adds 11 or 14 pieces of K.

FIGS. 15A through 15D show waveforms for describing the operations of the counters 382 and 384 shown in FIG. 13 when the frequency of the RF signal is not locked to that of the recovery clock signal PLCK. FIG. 15A shows the waveform of the digital RF signal F(n). The digital RF signal F(n) has the equal duty 4T in the both side intervals where the voltage of the digital RF signal F(n) is higher and lower than that of the reference voltage, respectively. FIG. 15B shows the edge detection signal ED. FIG. 15C shows the second enable signal N26. FIG. 15D shows the third enable signal N32.

Referring to FIGS. 13 and 15, the adder 382 is enabled by the second enable signal N26 which is logic high at a point of time P1 as shown in FIG. 15C, and the edge detection signal ED is enabled to logic high at a point of time P1. Since the edge detection signal ED is firstly enabled while the adder 382 is enabled, the adder 382 cumulatively adds α which is the absolute value of the digital RF signal F(n) input to the input terminal IN1. Since the edge detection signal ED is disabled at points of P2, P3, and P4, the adder 382 cumulatively adds the value of K input to the input terminal IN2. The edge detection signal ED is secondly enabled at the point of time P5.

Therefore, the adder 382 cumulatively adds p which is the absolute value of F(n−1) obtained by delaying the digital RF signal F(n) by 1T. The adder 382 is disabled by the second enable signal N26 which is low at the point of time P6. As a result, the adder 382 cumulatively adds (3, 1, 1, pieces of K, α, β, respectively) while enabled.

Also, the adder 384 is enabled by the third enable signal N32 which is logic high at the point of time P5 as shown in FIG. 15D and the edge detection signal ED is enabled to logic high at the point of time P5. At this time, since the edge detections ignal ED is firstly enabled while the adder 384 is enabled, the adder 384 cumulatively adds γ which is the absolute value of the digital RF signal F(n) input to the input terminal IN1. Since the edge detection signal ED is disabled at the points of time P6, P7, and P8, the adder 384 cumulatively adds the value of K input to the input terminal IN2. The edge detection signal ED is secondly enabled at the point of time P9. Therefore, the adder 384 cumulatively adds 6 which is the absolute value of F(n−1) obtained by delaying the digital RF signal F(n) by 1T. The adder 384 is disabled by the third enable signal N32 which is low at the point of time P10. As a result, the adder 384 cumulatively K, γ, δ, adds(3, 1, 1 amounts of values respectively).

In the case that the frequency of the RF signal is not locked to that of the recovery clock signal PLCK, when the duty of the RF signal is 4T, the adder 382 or the adder 384 cannot count pieces 4 values of K. When the duty of the RF signal is 11T or 14T, the counter 582 or the adder 384 cannot count 11 or 14 values of K.

In a typical CD player, a signal having the maximum duty 11T is successively generated twice in a period of 588T. In a typical DVD player, a signal having the maximum duty 14T is generated once in a period of 588T. The signal having the maximum duty is used when the frequency of the recovery clock signal PLCK is controlled. For example, in a conventional technology, the duty of a signal is counted using a frequency which is double the frequency of the recovery clock signal PLCK while the signal having the maximum duty is input. Therefore, when the maximum duty is 11T, 22 is counted, when the maximum duty is 14T, 28 is counted, and so on. Meanwhile, in the present invention, the value of K or the value of the digital RF signal F(n) is counted while the signal having the maximum duty is input. Therefore, when the maximum duty is 11T, (10 K+α+β) or (10 K+γ+δ) is counted. When the maximum duty is 14T, (13K+α+β) or (13K+γ+δ) is counted. When it is assumed that K is 14, when the maximum duty is 11T, (140+α+β) or (140+γ+δ) is counted. When the maximum duty is 14T, (182+α+β) or (182+γ+δ) is counted. As a result, according to the present invention, when a signal having the maximum duty is input, the recovery clock signal PLCK is not counted but K or the digital RF signal F(n) is counted. Accordingly, it is possible to control the frequency more accurately than in the conventional technology.

Figure 16:
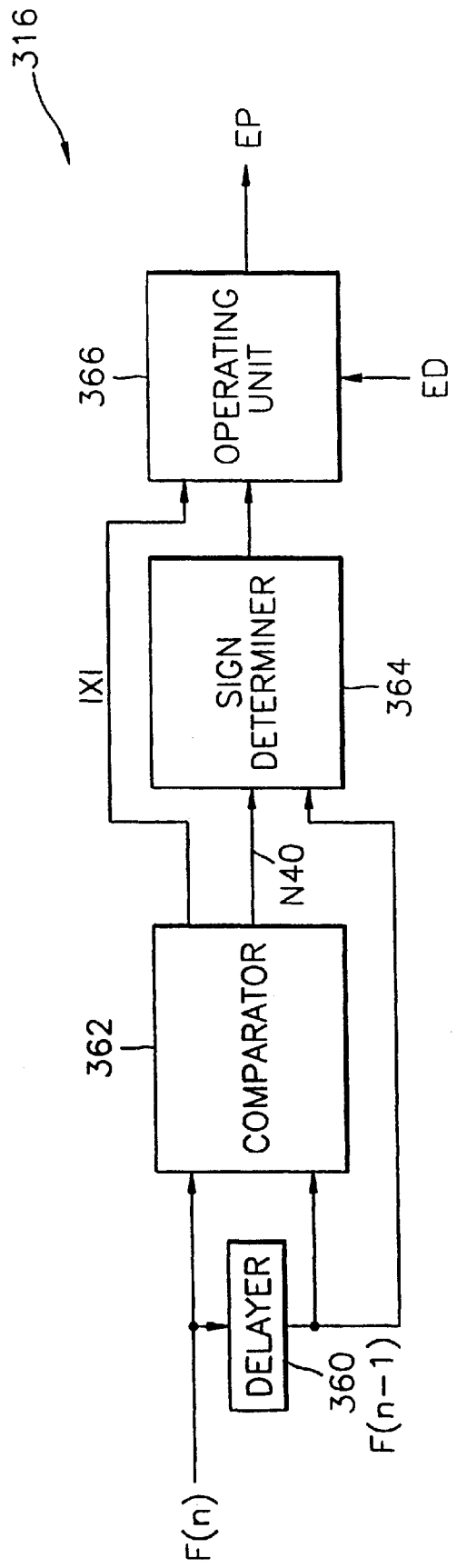
FIG. 16 is a detailed block diagram of the phase error detector of FIG. 9 in accordance with the present invention.

FIG. 16 is a detailed block diagram of the phase error detector 316 of FIG. 9. The phase error detector 316 includes a delayer 360, a comparator 362, a sign determiner 364, and an operating unit 366.

The delayer shown in FIG. 16 generates a first delay signal F(n−1) by delaying the digital RF signal F(n) by 1T. The comparator 362 compares the absolute value of the first delay signal F(n−1) with that of the digital RF signal F(n) and outputs the smaller absolute value between the two as the signal N40 and the absolute value |x| of the smaller absolute value. The sign determiner 364 determines whether the signal N40 generated by the comparator 362 has the same sign as that of the first delay signal F(n−1).

The operating unit 366 adds a positive (+) sign to the absolute value |x| generated by the comparator 362 and outputs the obtained value as the phase error EP when it is determined that the sign of the signal N40 is the same as that of the first delay signal F(n−1) by the sign determiner 364, in response to the edge detection signal ED. The operating unit 366 adds a negative (−) sign to the absolute value generated by the third comparator 362 and outputs the obtained value as the phase error EP when it is determined that the sign of the signal N40 is different from that of the first delay signal F(n−1) by the sign determiner 364 in response to the edge detection signal ED. The phase error EP is updated whenever the edge detection signal ED is generated.

FIGS. 17A through 17D show waveforms for describing the operation of the phase error detector 316 in more detail. FIG. 17A shows a case where the phase of the recovery clock signal PLCK leads that of the digital RF signal. FIG. 17B shows the edge detection signal ED in the case where the phase of the recovery clock signal PLCK leads that of the digital RF signal. FIG. 17C shows a case where the phase of the recovery clock signal PLCK lags that of the digital RF signal. FIG. 17D shows the edge detection signal ED in the case where the phase of the recovery clock signal PLCK lags that of the digital RF signal.

Referring to FIG. 17A, when the phase of the recovery clock signal PLCK leads that of the digital RF signal, the absolute value of the first delay signal F(n−1) is smaller than that of the digital RF signal F(n) in a section where the edge detection signal ED is enabled as shown in FIG. 17B. Therefore, the comparator 362 outputs the first delay signal F(n−1) to the sign determiner 364 and outputs the absolute value |x| of the first delay signal F(n−1) to the operating unit 366.

Namely, the signal output from the comparator 362 and the signal output from the delayer 360 are the first delay signal F(n−1), so that the sign determiner 364 determines that the signs of the two signals are identical. Therefore, the operating unit 366 adds the positive (+) sign to the absolute value |x| of the first delay signal F(n−1) to obtain the phase error EP.

Referring to FIG. 17C, when the phase of the recovery clock signal PLCK lags that of the digital RF signal, the absolute value of the digital RF signal F(n) is smaller than that of the first delay signal F(n−1) in a section where the edge detection signal ED is enabled as shown in FIG. 17D. Therefore, the comparator 362 outputs the digital RF signal F(n) to the sign determiner 364 and outputs the absolute |x| to the operating unit 366. The sign determiner 364 determines that the sign of the signal F(n) output from the comparator 362 and the sign of the first delay signal F(n−1) output from the delayer 360 are opposite to each other. Therefore, the operator 366 adds the negative sign (−) to the absolute value |x| to the absolute value of the digital RF signal F(n) to obtain the phase error EP.

Figure 18:
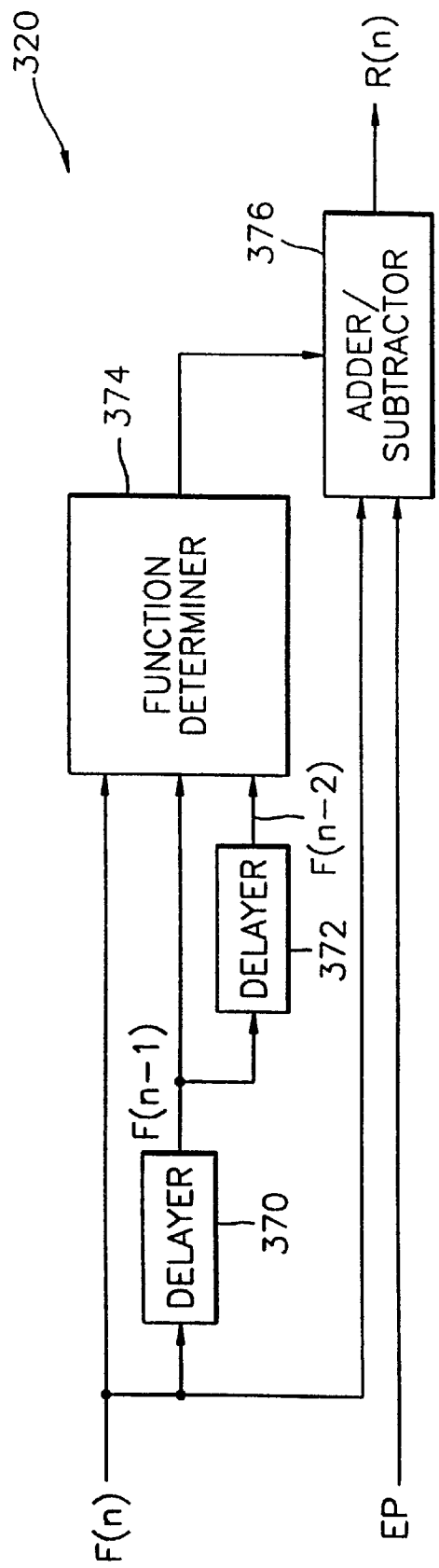
FIG. 18 is a detailed block diagram of the phase compensator of FIG. 9 in accordance with the present invention.

FIG. 18 is a detailed block diagram of the phase compensator 320 of FIG. 9. The phase compensator 320 includes delayers 370 and 372, a function determiner 374, and an adder/subtractor 376.

In FIG. 18, the delayer 370 generates a first delay signal F(n−1) by delaying the digital RF signal F(n) by 1T. The delayer 372 generates a second delay signal F(n−2) by delaying the first delay signal F(n−1) by 1T. The function determiner 364 receives F(n), F(n−1), and F(n−2), determines whether the digital RF signal is a decreasing function or an increasing function, and outputs the result. The adder/subtractor 376 adds the phase error EP to the digital RF signal F(n) when the digital RF signal is an increasing function and subtracts the phase error EP from the digital RF signal F(n) when the digital RF signal is a decreasing function, thus compensating for the phase of the digital RF signal so that the phase of the digital RF signal is locked to that of the recovery clock signal PLCK, and outputs the phase compensated digital RF signal R(n) to the viterbi decoder 318.

For example, as shown in FIG. 17A, when the phase of the digital RF signal lags that of the recovery clock signal PLCK and the digital RF signal is a decreasing function as shown in A, it is possible to lock the phase of the digital RF signal to that of the recovery clock signal PLCK by obtaining the phase error EP by adding the positive (+) sign to the absolute value of F(n−1), and subtracting the phase error from the digital RF signal. When the digital RF signal is an increasing function as shown in B of FIG. 17A, it is possible to lock the phase of the digital RF signal to that of the recovery clock signal PLCK by obtaining the phase error by adding the positive (+) sign to the absolute value of F(n−1), and adding the phase error to the digital RF signal.

As shown in FIG. 17C, when the phase of the digital RF signal leads that of the recovery clock signal and the digital RF signal is the decreasing function as shown in C, it is possible to lock the phase of the digital RF signal to that of the recovery clock signal PLCK by obtaining the phase error EP by adding the negative (−) sign to the absolute value of F(n), and subtracting the phase error from the digital RF signal. As shown in D of FIG. 17C, when the digital RF signal is a decreasing function, it is possible to lock the phase of the digital RF signal to that of the recovery clock signal PLCK by obtaining the phase error EP by adding the negative (−) sign to the absolute value of F(n), and adding the phase error to the digital RF signal.

As mentioned above, it is possible to lock the phase of the digital RF signal to that of the recovery clock signal PLCK by obtaining the phase error between the digital RF signal and the recovery clock signal PLCK and adding the obtained phase error to the digital RF sginal or subtracting the obtained phase error from the digital RF signal according to whether the digital RF signal is an increasing or decreasing function.

The operations of the phase error detector 316 shown in FIG. 16 and the phase compensator 320 shown in FIG. 18 will now be described in more detail with reference to FIGS. 16, 17, and 18. When the phase of the digital RF signal lags that of the recovery clock signal PLCK as shown in FIG. 17A and the edge detection signal ED is enabled in the section A, the operating unit 366 generates the phase error EP by adding the positive (+) sign to the absolute value of F(n−1). The operating unit 366 updates the phase error EP whenever the edge detection signal ED is enabled. The function determiner 374 determines whether the digital RF signal is a decreasing or increasing function using the values of F(n), F(n−1), and F(n−2) which are three successive digital RF signals. The adder/subtractor 376 adds the phase error EP to the digital RF signal F(n) or subtracts the phase error EP from the digital RF signal F(n) according to the function determination result of the function determiner 374, thus locking the phase of the digital RF signal to that of the recovery clock signal PLCK. Then, when the edge detection signal ED is generated in the section B of FIG. 17A, the operating unit 366 generates the phase error EP obtained by adding a positive (+) sign to the absolute value of F(n−1) in the section B as the phase error EP and locks the phase of the digital RF signal to that of the recovery clock signal PLCK by the above-mentioned operations of the function determiner 374 and the adder/subtractor 376.

When the phase of the digital RF signal leads that of the recovery clock signal PLCK as shown in FIG. 17C and the edge detection signal ED is enabled in the section C, the operating unit 366 generates the phase error by adding a negative (−) sign to the absolute value of F(n). At this time, the operating unit 366 updates the phase error EP whenever the edge detection signal ED is enabled. The function determiner 374 determines whether the digital RF signal is a decreasing or increasing function using the values of the three successive digital RF sginals F(n), F(−1), and F(n−2). The adder/subtractor 376 adds the phase error EP to the digital RF signal F(n) or subtracts the phase error EP from the digital RF signal F(n) according to the function determination result of the function determiner 374, thus locking the phase of the digital RF signal to that of the recovery clock signal PLCK. Then, when the edge detection signal ED is generated in the section D of FIG. 17C, the operating unit 366 generates the phase error EP obtained by adding the negative (−) sign to the absolute value of F(n) in the section D as the phase error EP and locks the phase of the digital RF signal to that of the recovery clock signal PLCK by the above-mentioned operations of the function discriminator 374 and the adder/subtractor 376.

It is possible to increase the stability of the system significantly not by controlling the voltage controlled oscillator like in the conventional technology but by controlling the phase of the digital RF signal with the frequency of the recovery clock signal PLCK fixed in compensating for the phase error betwen the recovery clock signal PLCK and the digital RF signal.

While this invention has been particularly shown and described with references to preferred embodiments thereof, it will be understood by those skilled in the art that various changes in form and details may be made therein without departing from the spirit and scope of the invention as defined by the appended claims.

As mentioned above, according to the data restoring apparatus of the optical disk reproducing system of the present invention, it is possible to restore correct data since, when the digital RF signal obtained by digitally converting the RF signal crosses the reference voltage, the phase error and the cumulatively added error value are correctly extracted by adding a prior value to the post value and the phase and the reference voltage are compensated for according to the phase error and the cumulatively added error value. Also, it is possible to simply realize and control the filter since using the digital filter has a cut-off frequency regardless of the speed.

It is possible to increase the stability of the system by locking the phase of the recovery clock signal to that of the RF signal by changing the phase of the RF signal while the frequency of the recovery clock signal is fixed when the frequency of the RF signal is locked to that of the recovery clock signal PLCK.

Also, it is possible to control the frequency more correctly not by simply counting the recovery clock signal but by cumulatively adding predetermined values or the values of the digital RF signal in response to the recovery clock signal when the frequency of the recovery clock signal is controlled by detecting the maximum duty signal.

I claim:

1. A data restoring apparatus in an optical disk reproducing system for restoring data recorded on an optical disk from an RF signal read from the optical disk, comprising:

an analog to digital converter (ADC) for digitally converting the RF signal in response to a recovery clock signal and generating the digitally converted signal as a digital RF signal;

a decoder for decoding the digital RF signal and generating a decoded bit stream as restored data;

an adaptive phase error compensator for obtaining the phase error between the RF signal and the recovery clock signal and for generating a control voltage corresponding to the phase error; and a voltage controlled oscillator for generating the phase compensated recovery clock signal by varying the frequency of the recovery clock signal according to the control voltage, wherein the adaptive phase error compensator adds a predetermined number of successive digital RF signals generated around a reference voltage and obtains the sum as the phase error.

2. The apparatus of claim 1, further comprising:

an asymmetry compensator for digitally compensating for the asymmetry of the signal received from the ADC; and a digital filter for filtering the asymmetry-compensated signal received from the asymmetry compensator and for generating a waveform-shaped signal as the digital RF signal.

3. The apparatus of claim 1, wherein the adaptive phase error compensator comprises:

a phase error detector for adding the predetermined number of successive digital RF signals generated around the reference voltage and generating the addition result as the phase error between the RF signal and the recovery clock signal;

an adaptive controller for cumulatively adding the phase error over a predetermined time, obtaining the mean value as a mean error value, comparing the magnitude of the mean error value with that of a first threshold value, and generating a pulse width selection signal according to the comparison result; and a control voltage generator for generating a plurality of pulse width modulation (PWM) signals having various pulse widths, selecting one among the plurality of PWM signals according to the pulse width selection signal, and generating a control voltage according to the selected PWM signal and the phase error.

4. The apparatus of claim 3, wherein the phase error detector comprises:

first and second delayers for generating first and second delay signals by respectively delaying the digital RF signal by 1T and 2T, where T is the period of the recovery clock signal;

a comparator for determining whether the absolute value of the first delay signal is smaller than a second threshold value and generating the first control signal which is enabled when the absolute value of the first delay signal is smaller than the second threshold value; and an adder for adding the digital RF signal to the first and second delay signals and outputting the addition result as the phase error when the first control signal is enabled.

5. The apparatus of claim 3, wherein the adaptive controller comprises:

a control signal generator for counting the first control signal, obtaining the number of times the digital RF signal crosses the reference voltage, and generating a second control signal which is enabled when the obtained number of times is an integer times P, where P is a natural number equal to or larger than 1;

a first mean error value generator for cumulatively adding the phase error larger than 0, dividing the cumulative addition result by P in response to the second control signal, and obtaining the mean value;

a second mean error value generator for cumulatively adding the phase error smaller than 0, dividing the cumulative addition result by P in response to the second control signal, and obtaining the mean value; and a selection signal generator for comparing mean error values generated by the first and second mean error value generators with a second threshold value and a third threshold value larger than the second threshold value in response to the second control signal and outputting the pulse width selection signal according to the comparison result.

6. The apparatus of claim 5, wherein the selection signal generator extracts first and second mean error values successively generated by the first mean error value generator and third and fourth mean error values successively generated by the second mean error value generator in response to the second control signal, generates a pulse width selection signal so that a control voltage is generated, the pulse width selection signal being generated so that a PWM signal whose pulse width is larger than that of the currently selected PWM signal in order to increase the strength of the control voltage is selected and that a PWM signal whose pulse width is smaller than that of the currently selected PWM signal in order to lower the strength of the control voltage is selected.

7. The apparatus of claim 3, wherein the control voltage generator comprises:

a PWM signal generator for receiving a pulse signal having a predetermined pulse width and generating first through mth (m is a natural number larger than 1) PWM signals;

a PWM selector for selecting one PWM signal among the first through mth PWM signals according to the PWM selection signal and outputting the selected PWM signal as the up signal or the down signal according to the sign of the phase error; and a low pass filter for low pass filtering the up signal or down signal output from the PWM selector and producing the low pass filtered signal as the control voltage.

8. The apparatus of claim 7, wherein the PWM signal generator comprises:

first through nth inverters having substantially similar delay characteristics and being serially connected, for delaying the pulse signal; and first through mth AND operating means for performing an AND operation on the odd numbered outputs of the inverter and the pulse signal and generating the AND operation results as first through mth PWM signals, wherein the delay width of the nth inverter is shorter than the pulse width of the pulse signal.

9. The apparatus of claim 1, wherein the decoder comprises a viterbi decoder.

10. A data restoring apparatus in an optical disk reproducing system for restoring data recorded on an optical disk from an RF signal read from the optical disk, comprising:

an analog-to-digital converter (ADC) for digitally converting the RF signal in response to a recovery clock signal and generating the converted signal as a digital RF signal;

an edge detector for detecting an edge at which the digital RF signal crosses the reference voltage, and generating the detected edge as an edge detection signal;

a frequency error compensator for detecting the frequency error between the digital RF signal and the recovery clock signal, for generating a control voltage for compensating for the frequency of the recovery clock signal according to the detected frequency error, and for locking the control voltage when the frequency of the recovery clock signal is locked to that of the digital RF signal;

a phase error compensator for obtaining a phase error indicating whether the phase of the recovery clock signal lags or leads that of the RF signal; and a decoder for decoding the phase compensated digital RF signal generated by the phase error compensator and generating the decoded bit stream as restored data.

11. The apparatus of claim 10, further comprising:

an asymmetry compensator for compensating for the asymmetry of a signal generated by the ADC; and a digital filter for filtering the asymmetry-compensated signal from the asymmetry-compensator, and for generating the waveform-shaped signal as the digital RF signal.

12. The apparatus of claim 10, wherein the phase error compensator comprises:

a phase error detector for obtaining a phase error indicating whether the phase of the recovery clock signal lags or leads that of the RF signal, in a section wherein the edge detection signal is enabled; and a phase compensator for adding the phase error to the digital RF signal or subtracting the phase error from the digital RF signal according to whether the digital RF signal is a decreasing function or an increasing function and outputting the phase compensated digital RF signal to the viterbi decoder.

13. The apparatus of claim 12, wherein the phase error detector comprises:

a first delayer for generating a first delay signal by delaying the digital RF signal by 1T, where T is the period of the recovery clock signal;

a comparator for comparing the absolute value of the first delay signal with that of the digital Rf signal and outputting the signal having the smaller absolute value and the absolute value of the signal;

a sign discriminator for determining whether the sign of the signal generated by the comparator is the same as that of the first delay signal; and an operating unit for adding a positive (+) or negative (−) sign to the absolute value generated by the comparator according to the sign discrimination result obtained by the sign discriminator and outputting the obtained result as the phase error, when the edge detection signal is enabled.

14. The apparatus of claim 13, wherein the operating unit adds a positive (+) sign to the absolute value generated by the comparator when it is determined that the sign of the signal generated by the comparator is the same as that of the first delay signal by the sign determiner and adding the negative (−) sign to the absolute value generated by the comparator when it is determined that the sign of the signal generated by the comparator is different from that of the first delay signal and generating the obtained result as the phase error.

15. The apparatus of claim 12, wherein the phase compensator comprises:

second and third delayers for delaying the digital RF signal by 1T and 2T and generating the first delay signal and the second delay signal;

a function determiner for receiving the first and second delay signals and the digital RF data and determining whether the digital RF signal is an increasing function or a decreasing function; and an adder/subtracter for subtracting the phase error from the digital RF signal when it is determined that the digital RF signal is a decreasing function by the function determiner, adding the phase error to the digital RF signal when the digital RF signal is an increasing function, and generating the phase-compensated digital RF signal.

16. The apparatus of claim 10, wherein the edge detector comprises:

a first OR operation means for performing an OR operation on the respective bits of the digital RF signal;

an exclusive OR operation means for performing an exclusive OR operation on the most significant bit (MSB) of the digital RF signal and the MSB of the first delay signal;

a NOR operation means for performing a NOR operation on each of the bits of the first delay signal;

an AND operation means for performing an AND operation on the signals generated by the first OR operation means and the exclusive OR operation means respectively; and second OR operation means for performing an OR operation on the signals generated from the AND operation means and the NOR operation means and generating the OR operation result as the edge detection signal.

17. A data restoring apparatus in an optical disk reproducing system for restoring data recorded on the optical disk from the RF signal read from the optical disk, comprising:

an analog-to-digital converter for digitally converting the RF signal in response to the recovery clock signal and generating the converted signal as a digital RF signal;

an edge detector for receiving the digital RF signal, an detecting an edge at which the digital RF signal crosses the reference voltage;

a frequency error compensator for obtaining a maximum coefficient value by cumulatively adding a predetermined value K, or the digital RF signal, according to the edge detection signal during the duration of the maximum duty signal (14T or 11T) in the RF signal in a period of the predetermined term;

a phase error compensator for obtaining a phase error according to whether the phase of the recovery clock signal lags or leads that of the RF signal and generating the phase-compensated digital RF signal; and a viterbi decoder for decoding the phase-compensated digital RF signal generated by the phase error compensator by a viterbi decoding method and generating the decoded bit stream as restored data.

18. The apparatus of claim 17, wherein the data restoring apparatus further comprises:

an asymmetry-compensator for digitally compensating for the asymmetry of the signal generated by the ADC; and a digital filter for filtering the asymmetry-compensated signal from the asymmetry compensator, and generating the waveform shaped signal as the digital RF signal.

19. The apparatus of claim 16, wherein the frequency error compensator comprises:

first and second comparators for comparing the digital RF signal with the reference voltage and generating a signal enabled when the voltage of the digital RF signal is higher than the reference voltage and a signal enabled when the voltage of the digital RF signal is lower than the reference voltage;

first and second delayers for delaying the signals generated by the first and second comparators by 1T and generating first and second delay signals;

first and second OR operation means for generating a first enable signal by performing an OR operation on the output signal of the comparator and the first delay signal, and a second enable signal by performing an OR operation on the output signal of the second comparator and the second delay signal, respectively;

a first accumulator for cumulatively adding the value K in response to the recovery clock signal in a section where the edge detection signal is disabled and cumulatively adding the digital RF signal in a section where the edge detection signal is enabled, when the first counter is enabled in response to the first enable signal;

a second accumulator for cumulatively adding the value K in response to the recovery clock signal in a section where the edge detection signal is disabled and cumulatively adding the digital RF signal in a section where the edge detection signal is enabled, when the second counter is enabled in response to the second enable signal;

a maximum value extractor for obtaining the maximum value among the values generated by the first and second accumulators and generating the maximum value as the maximum coefficient value; and a control voltage generator locked when the frequency error value becomes zero (0), for obtaining a frequency error value by subtracting a predetermined reference coefficient value from the maximum coefficient value and generating the control voltage corresponding to the frequency error value.

20. The apparatus of claim 19, wherein the first accumulator cumulatively adds the value K in a section where the edge detection signal is disabled, cumulatively adds the value of the digital RF signal in a section where the edge detection signal is firstly enabled, and cumulatively adds the value of the signal obtained by delaying the digital RF signal by 1T in a section where the edge detection signal is secondly enabled, in response to the recovery clock signal, when the first enable signal is enabled.

21. The apparatus of claim 19, wherein the second accumulator cumulatively adds value K in a section where the edge detection signal is disabled cumulatively adds the value of the digital RF signal in a section where the edge detection signal is firstly enabled, and adds the value of the signal obtained by delaying the digital RF signal by 1T in a section where the edge detection signal is secondly enabled, in response to the recovery clock signal, when the second enable signal is enabled.

22. A data restoring apparatus in an optical disk reproducing system for restoring data recorded on the optical disk from the RF signal read from the optical disk, comprising:

an analog-to-digital converter (ADC) for digitally converting the RF signal in response to a recovery clock signal;

an adder for adding a reference voltage compensation value to the signal generated by the ADC and generating the addition result as a digital RF signal;

a reference voltage compensator for obtaining a cumulatively added error value by adding a predetermined number of digital RF signals successively generated around a reference voltage and generating a reference voltage compensation value according to the obtained cumulatively added error value; and a viterbi decoder for decoding the digital RF signal by a viterbi decoding method and generating the decoded bit stream as restored data.

23. The apparatus of claim 22, wherein the reference voltage compensator comprises:

an error detector for obtaining an error value by adding the digital RF signal to a second delay signal obtained by delaying the digital RF signal by 2T where T is the period of a recovery clock signal, adding one or more successive error values to each other, and generating the addition result as the cumulatively added error value, when the absolute value of a first delay signal obtained by delaying the digital RF signal by 1T is smaller than a first threshold value; and a compensation value generator for up or down counting the recovery clock signal when the sign of the cumulatively added error value is changed, generating a first voltage compensation value when the counted value is a positive (+) second threshold value, and generating a second voltage compensation value whose magnitude is the same as the magnitude of the first voltage compensation value and whose sign is opposite to the sign of the first voltage compensation value when the counted value is a negative (−) second threshold value.

24. The apparatus of claim 23, wherein the compensation value generator comprises:

a sign comparator for detecting the sign of the cumulatively added error value;

an up/down counter for up or down counting the currently counted value by one when the sign of the cumulatively added error value detected by the sign comparator is changed, the up/down counter reset by a reset signal; and a comparator for generating the first or second voltage compensation value and generating the reset signal, when the value counted by the up/down counter reaches a second threshold value.

25. The apparatus of claim 23, wherein the magnitude of the first or second voltage compensation value corresponds to one step of quantization level when the RF signal is digitally converted by the ADC.

26. A data restoring apparatus of an optical disk reproducing system for restoring data recorded on the optical disk from the RF signal read from the optical disk, comprising:

an analog-to-digital converter for digitally converting the RF signal in response to a recovery clock signal and generating the digitally converted signal;

a digital sum value (DSV) controller for receiving the digitally converted signal and generating a voltage compensation value so that the number of signals having levels higher than a reference voltage is equal to the number of signals having levels lower than the reference voltage;

an adder for adding the voltage compensation value to the signal generated by the analog-to-digital converter and generating the addition result as a digital RF signal; and a viterbi decoder for decoding the digital RF signal by a viterbi decoding method and generating the decoded bit stream as restored data.

27. The apparatus of claim 26, wherein the DSV controller comprises:

a comparator for comparing the magnitude of the digitally converted signal with that of the reference voltage;

a DSV counter for up or down counting the recovery clock signal according to the comparison result of the comparator, generating a first compensation value when the counted value becomes a positive (+) threshold value, and generating a second compensation value whose magnitude is the same as the magnitude of the first compensation value and whose sign is opposite to the sign of the first compensation value when the second count value becomes a negative (-) threshold value, the DSV counter reset after generating the first or second compensation value; and a compensation value generator for cumulatively adding the first or second voltage compensation value generated by the DSV counter and outputting the cumulatively added value as the reference voltage compensation value.

28. The apparatus of claim 27, wherein the magnitude of the first or second voltage compensation value corresponds to one step of the quantization level when the RF signal is digitally converted by the analog-to-digital converter.

29. An apparatus for compensating for the asymmetry of a received analog signal, comprising:

an analog to digital converter for digitally converting the analog signal in response to a recovery clock signal;

an adder for adding a reference voltage compensation value to the signal generated by the ADC and generating the addition result as a digital signal; and a reference voltage compensator for obtaining a cumulatively added error value by adding a predetermined number of successive digital signals around the reference voltage when the digital signal approaches the reference voltage and generating the reference voltage compensation value according to the obtained cumulatively added error value.

30. The apparatus of claim 29, wherein the reference voltage compensator comprises:

an error detector for obtaining an error value by adding the digital signal to a second delay signal obtained by delaying the digital RF signal by 2T, where T is the period of a recovery clock signal, adding the one or more successive error values, and generating the addition result as the cumulatively added error value, when the absolute value of a first delay signal obtained by delaying the digital signal by 1T is smaller than a first threshold value; and a compensation value generator for up or down counting the recovery clock signal when the sign of the cumulatively added error value is changed, generating a first voltage compensation value when the counted value becomes a positive (+) second threshold value, and generating a second voltage compensation value whose magnitude is the same as the magnitude of the first voltage compensation value and whose sign is opposite to the sign of the first voltage compensation value when the counted value becomes a negative (-) second threshold value.

31. The apparatus of claim 30, wherein the compensation value generator comprises:

a sign compensator for detecting the sign of the cumulatively added error value;

an up/down counter for up or down counting the recovery clock signal when the sign of the cumulatively added error value detected by the sign compensator is changed, the up/down counter reset in response to a reset signal; and a comparator for generating the first or second voltage compensation value and generating the reset signal when the value counted by the up/down counter reaches a second threshold value.

32. The apparatus of claim 30, wherein the magnitude of the first or second voltage compensation value corresponds to one step of the quantization level when the RF signal is digitally converted by the analog-to-digital converter.

33. An apparatus for compensating for the asymmetry of a received analog signal, comprising:

an analog-to-digital converter for digitally converting the analog signal in response to a recovery clock signal;

a DSV controller for receiving a digital signal generated by the ADC and generating a voltage compensation value so that the number of signals having levels larger than a reference voltage is equal to the number of signals having levels smaller than the reference voltage; and an adder for adding the voltage compensation value to the signal generated by the ADC and generating the addition result as an asymmetry-compensated digital signal.

34. The apparatus of claim 33, wherein the DSV controller comprises:

a comparator for comparing the magnitude of the digital signal with that of a reference voltage;

a DSV counter for up or down counting the recovery clock signal according to the compensation result by the comparator, generating a first compensation value when the counted value becomes a positive (+) threshold value, and generating a second compensation value whose magnitude is the same as the magnitude of the first compensation value and whose sign is opposite to the sign of the first compensation value when the first count value becomes a negative (-) threshold value, the DSV counter reset after generating the first or second compensation values; and a compensation value generator for cumulatively adding the first or second compensation value generated by the DSV counter and outputting the cumulatively added value as the reference voltage compensation value.

35. The apparatus of claim 34, wherein the magnitude of the first or second voltage compensation value corresponds to one step of the quantization levels when the RF signal is digitally converted by the ADC.

* * * * *

UNITED STATES PATENT AND TRADEMARK OFFICE
CERTIFICATE OF CORRECTION

PATENT NO. : 6,483,793 B1  Page 1 of 1
DATED : November 19, 2002
INVENTOR(S) : Ii-kwon Kim It is certified that error appears in the above-identified patent and that said Letters Patent is hereby corrected as shown below:

<u>Title page, Item [54] and Column 1, line 3,</u>
Please insert -- THROUGH ADAPTIVE PHASE/FREQUENCY ERROR COMPENSATION -- after "SYSTEM".

Signed and Sealed this

Nineteenth Day of August, 2003

JAMES E. ROGAN
*Director of the United States Patent and Trademark Office*